(12) United States Patent
Lai

(10) Patent No.: US 9,029,216 B1
(45) Date of Patent: May 12, 2015

(54) MEMORY AND MANUFACTURING METHOD THEREOF

(71) Applicant: Macronix International Co., Ltd., Hsinchu (TW)

(72) Inventor: Erh-Kun Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 50 days.

(21) Appl. No.: 14/058,331

(22) Filed: Oct. 21, 2013

(51) Int. Cl.
 *H01L 21/8239* (2006.01)
 *H01L 27/115* (2006.01)
 *H01L 21/28* (2006.01)
 *H01L 21/8234* (2006.01)
 *H01L 29/66* (2006.01)

(52) U.S. Cl.
 CPC .... *H01L 27/11578* (2013.01); *H01L 21/28273* (2013.01); *H01L 21/823431* (2013.01); *H01L 21/823468* (2013.01); *H01L 29/6656* (2013.01)

(58) Field of Classification Search
 USPC .......................................................... 438/267
 See application file for complete search history.

(56) References Cited

U.S. PATENT DOCUMENTS

| | | | | |
|---|---|---|---|---|
| 6,818,512 B1* | 11/2004 | Hsieh | .......................... | 438/267 |
| 7,037,787 B2* | 5/2006 | Fan et al. | ...................... | 438/267 |
| 8,933,457 B2* | 1/2015 | Lai | ................... | 257/66 |
| 2011/0018051 A1* | 1/2011 | Kim et al. | ..................... | 257/324 |
| 2011/0298013 A1* | 12/2011 | Hwang et al. | ................. | 257/208 |
| 2011/0303971 A1* | 12/2011 | Lee et al. | ...................... | 257/324 |
| 2012/0068241 A1* | 3/2012 | Sakuma et al. | ............... | 257/314 |

* cited by examiner

*Primary Examiner* — Stephen W Smoot
(74) *Attorney, Agent, or Firm* — McClure, Qualey & Rodack, LLP

(57) ABSTRACT

A memory comprises a substrate, a plurality of bit line stacks of alternate semiconductor layers and first insulating layers, a memory layer, a plurality of second insulating layers, and a plurality of string select structures. The bit line stacks are disposed over the substrates and arranged in parallel. Each of the bit line stacks has two opposite sidewalls. The memory layer is disposed on the sidewalls of the bit line stacks. The second insulating layers are disposed on the bit line stacks, respectively. The string select structures are disposed correspondingly to the bit line stacks. Each of the string select structures comprises a first conductive layer and two liners, the semiconductor layer is disposed on a corresponding second insulating layer, and the two liners are disposed respectively along the two opposite sidewalls of a corresponding bit line stack and connected the first conductive layer.

9 Claims, 29 Drawing Sheets

MEMORY AND MANUFACTURING METHOD THEREOF

BACKGROUND

1. Technical Field

The present invention relates in general to a memory and a manufacturing method thereof. More particularly, this invention relates to a memory of which the word lines and the string select structures are formed by different processing steps, and a manufacturing method thereof.

2. Description of the Related Art

For high-density memory devices, the amount of data per unit area on an integrated circuit is a critical factor. As such, three-dimensional (3D) memory array structures have been developed to achieve greater storage density and lower costs per bit.

In a typical 3D memory array, a plurality of stacks of alternate semiconductor strips and insulating strips are formed, wherein the semiconductor strips are used, for example, as bit lines of the memory. A memory layer is formed on the stacks. Word lines are formed on the memory layer orthogonally to the stacks. At one end of the structure, every other stack is terminated by a stair-step structure, and every other stack is terminated by one of separate source contacts. The stacks terminated by the stair-step structure at said end are terminated by separate source contacts at the other end of the structure, and the stacks terminated by the separate source contacts at said end are terminated by a stair-step structure at the other end. The stacks are coupled to string select structures through portions near the ends terminated by the stair-step structures. In general, the string select structures are patterned at the same step that the word lines are defined.

SUMMARY

The present invention provides a memory. The word lines and the string select structures of the memory are formed by different processing step. This is beneficial for self alignment of the string select structures, and thereby the structure symmetry is improved. Besides, all of the stacks of semiconductor strips are terminated at one end of the structure by a single stair-step structure, and terminated at the other end by a single source contact. This is beneficial for enhancement of the structure strength. The present invention also provides a method for manufacturing the memory.

According to some embodiments of the present invention, a memory comprises a substrate, a plurality of bit line stacks of alternate semiconductor layers and first insulating layers, a memory layer, a plurality of second insulating layers, and a plurality of string select structures. The bit line stacks are disposed over the substrate and arranged in parallel. Each of the bit line stacks has two opposite sidewalls. The memory layer is disposed on the sidewalls of the bit line stacks. The second insulating layers are respectively disposed on the bit line stacks. The string select structures are disposed correspondingly to the bit line stacks. Each of the string select structures comprises a first conductive layer and two liners, wherein the first conductive layers is disposed on corresponding one of the second insulating layers, and the two liners are disposed respectively along the two opposite sidewalls of corresponding one of the bit line stacks and connected with the first conductive layer.

According to some embodiments of the present invention, a manufacturing method of the memory comprises following steps. A substrate with a stack of alternate semiconductor layers and first insulating layers thereover is provided. A second insulating layer is formed on the stack. A first conductive layer is formed on the second insulating layer. The first conductive layer, the second insulating layer and the stack are patterned to form a plurality of bit line stacks, a plurality of second insulating layers corresponding to the bit line stacks, and a plurality of first conductive layers corresponding to the bit line stacks. A memory layer is formed and covers the bit line stacks. Parts of the memory layer are removed to expose the first conductive layers. A plurality of liners are formed respectively along sidewalls of the bit line stacks, such that the liners are connected with the first conductive layers to form a plurality of string select structures.

BRIEF DESCRIPTION OF THE DRAWINGS

For purposes of explanation, numerous specific details are set forth with reference to the drawings to provide a thorough understanding of the disclosed embodiments. It will be apparent, however, that one or more embodiments may be practiced without these specific details. In other instances, well-known structures and devices are schematically shown in order to simplify the drawing.

FIGS. 2A~2I are schematic illustrations showing various stages of a manufacturing method according to one embodiment of the present invention.

Figure 1A:
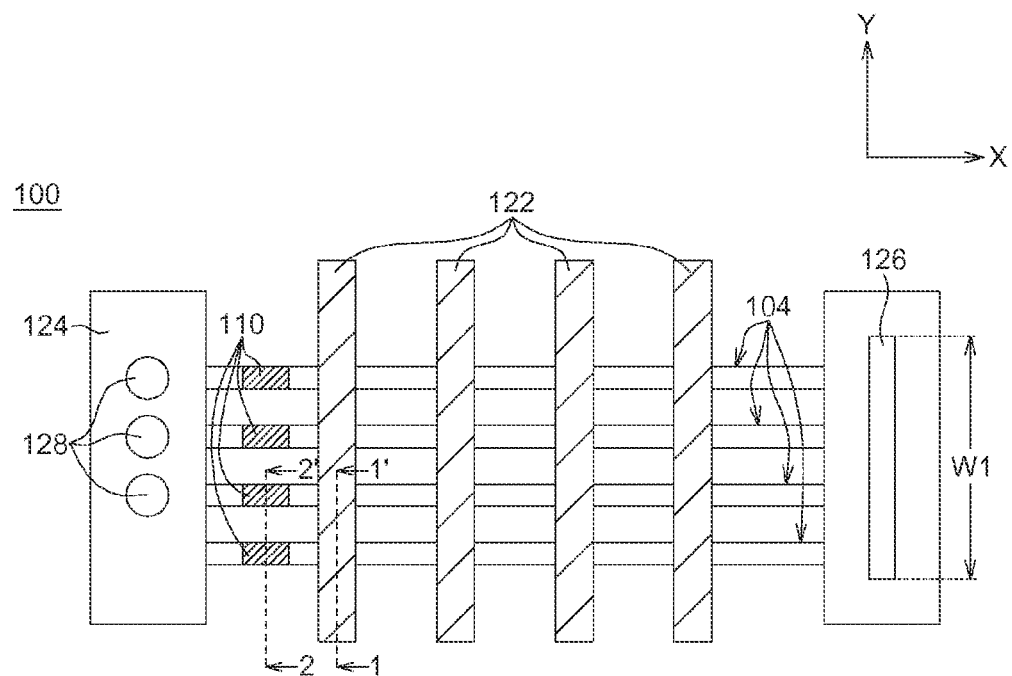
FIGS. 1A~1C are schematic illustrations of a memory according to one embodiment of the present invention.

To facilitate understanding, identical reference numerals have been used, where possible, to designate identical elements that are common to the figures. For clarity, the relative sizes of elements shown in the figures may not be the same as their real relative sizes, and some of the elements and the reference numerals are omitted.

DETAILED DESCRIPTION

A memory and a manufacturing method thereof according to the present invention are described below with reference to the drawings.

Figure 1B:
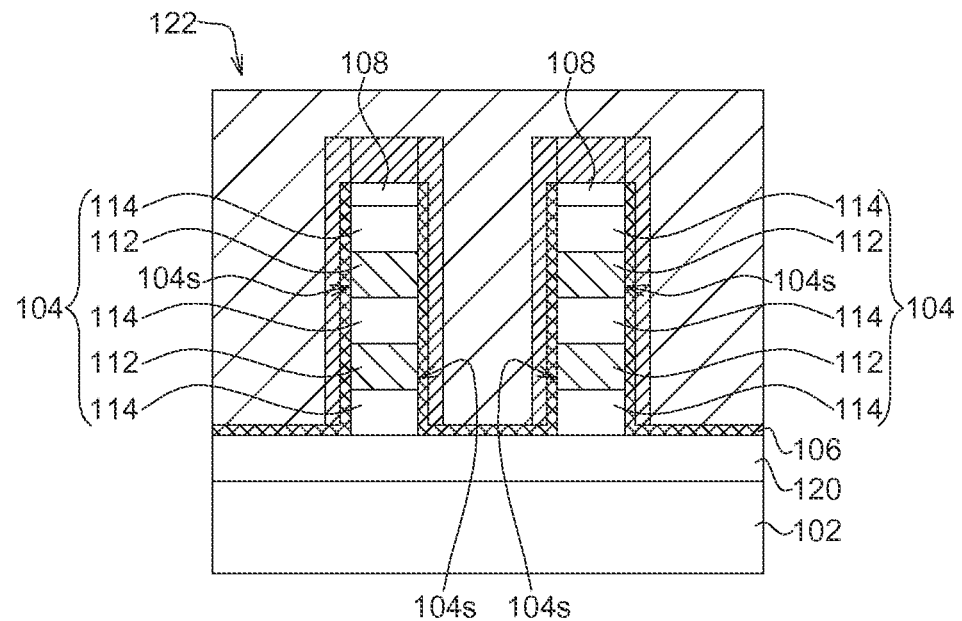
Figure 1C:
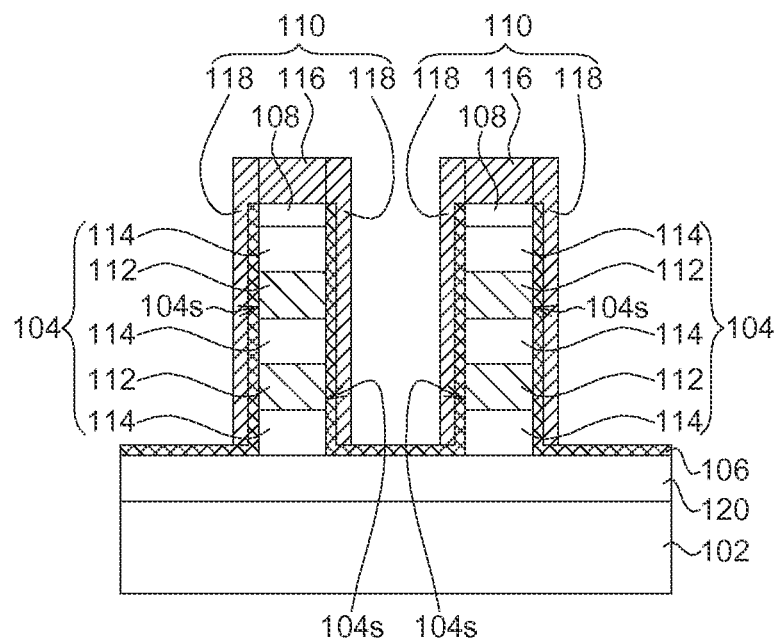

FIGS. 1A~1C are schematic illustrations of a memory 100 according to one embodiment of the present invention. FIG. 1A shows a top view. FIG. 1B shows the 1-1' cross section of FIG. 1A. FIG. 1C shows the 2-2' cross section of FIG. 1A. For clarity, some insulating materials are removed from FIGS. 1A~1C.

The memory 100 comprises a substrate 102, a plurality of bit line stacks 104, a memory layer 106, a plurality of second insulating layers 108 and a plurality of string select structures 110. The bit line stacks 104 are disposed over the substrate 102 and arranged in parallel, for example, along the X direction in FIG. 1. Each of the bit line stacks 104 comprises semiconductor layers 112 and first insulating layers 114 disposed alternatively. While two semiconductor layers 112 and three first insulating layers 114 are shown in the figures, the numbers of the semiconductor layers 112 and the first insulating layers 114 are not limited thereto. The bit line stacks 104 may each comprise numerous semiconductor layers 112 and numerous first insulating layers 114 disposed alternatively. In one embodiment, the semiconductor layers 112 are polysilicon layers, and the first insulating layers 114 are oxide layers. Each of the bit line stacks 104 has two opposite sidewalls 104s. The memory layer 106 is disposed on the sidewalls 104s. The memory layer 106 has a structure of, for example, oxide-nitride-oxide (ONO) or oxide-nitride-oxidenitride-oxide (ONONO). The second insulating layers 108 are disposed on the bit line stacks 104, respectively. The second insulating layers 108 are made of, for example, an oxide.

Figure 22:
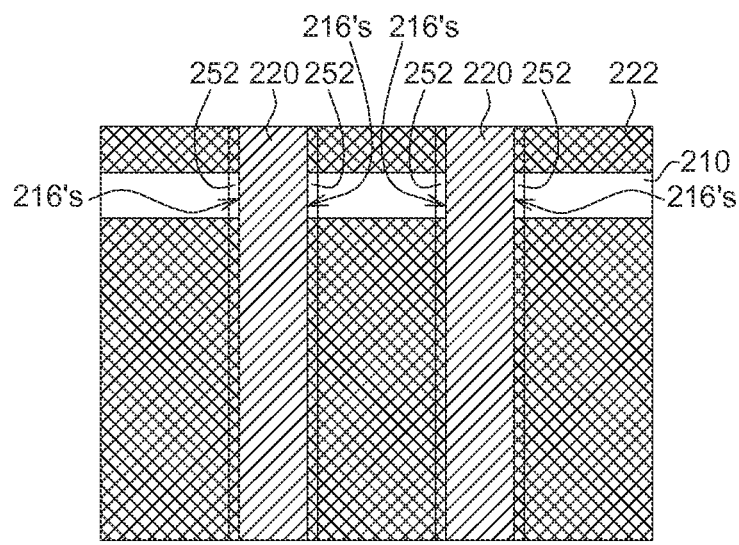
FIG. 22 is a schematic illustration showing one stage of a manufacturing method according to another embodiment of the present invention.

The string select structures 110 are disposed correspondingly to the bit line stacks 104. Each of the string select structures 110 comprises a first conductive layer 116 and two liners 118. The first conductive layer 116 is disposed on the corresponding second insulating layer 108. The liners 118 are disposed respectively along the two opposite sidewalls 104s of the corresponding bit line stack 104 and connected with the first conductive layer 116. The first conductive layer 116 and the two liners 118 are made of the same material, such as heavily p-doped (P+) polysilicon or conductor. In some embodiments, P+ polysilicon may be more suitable than N+ polysilicon due to lower threshold voltage (Vt) and higher speed for device erase. As shown in FIG. 1C, the liners 118 of the string select structures 110 and the sidewalls 104s of the bit line stacks 104 are isolated by the memory layer 106 to prevent a short circuit due to the contact between the liners 118 and the semiconductor layers 112 of the bit line stacks 104. Alliteratively, at positions corresponding to the string select structures 110, the liners 118 and the sidewalls 104s are isolated by an oxide layer (detailed description will be provided with reference to FIG. 22).

Further, the memory 100 may comprises a barrier layer 120. The barrier layer 120 is disposed on the substrate 102, and the bit line stacks 104 are disposed on the barrier layer 120. The barrier layer 120 is, for example, an oxide layer, and may be used as an etch stop layer during the process.

Please refer back to FIG. 1A, the memory 100 further comprises a plurality of word lines 122, a bit line pad structure 124 and a source contact 126. The word lines 122 are arranged parallel to an aligned direction of the string select structures 110 and orthogonal to the bit line stacks 104. More specifically, as illustrated in the example of FIG. 1A, the string select structures 110 are aligned along the Y direction, the word lines 122 are arranged in parallel along the Y direction, and the word lines 122 arranged along the Y direction are orthogonal to the bit line stacks 104 arranged along the X direction.

One end of the bit line stacks 104 is connected to the single source contact 126. The source contact 126 is shaped as a trench or holes through levels of the bit line stacks 104. As the width W1 of the source contact 126 increases, the resistance of the source contact 126 decreases, and thereby the bit line resistance is reduced. In addition, a wider width W1 is beneficial for obtaining a wider process window. Since the one end of the bit line stacks 104 is connected to the single source contact 126 through the levels of the bit line stacks 104, the memory 100 according to the embodiment has a higher mechanical strength than the typical 3D memory array.

The other end of the bit line stacks 104 (which opposites to the end near the source contact 126) is connected to the stairstep-like bit line pad structure 124. The bit line pad structure 124 comprises vertical conductors 128 coupled to bit lines pads, which are connected to different levels of the semiconductor layers 112, respectively.

The bit line stacks 104 are coupled to string select structures 110 through portions near the end terminated by the bit line pad structure 124. The string select structures 110 are disposed at the same side of the bit line stacks 104. Since one end of the bit line stacks 104 is connected to the single source contact 126 and the other end is connected to the bit line pad structure 124, and all of the string select structures 110 are disposed at the same side of the bit line stacks 104, the memory 100 is more symmetrical than the typical 3D memory array.

The disclosure is now directed to a manufacturing method according to one embodiment of the present invention with reference to FIGS. 2A~21. The method is suitable for manufacturing a memory as described above.

Figure 2A:
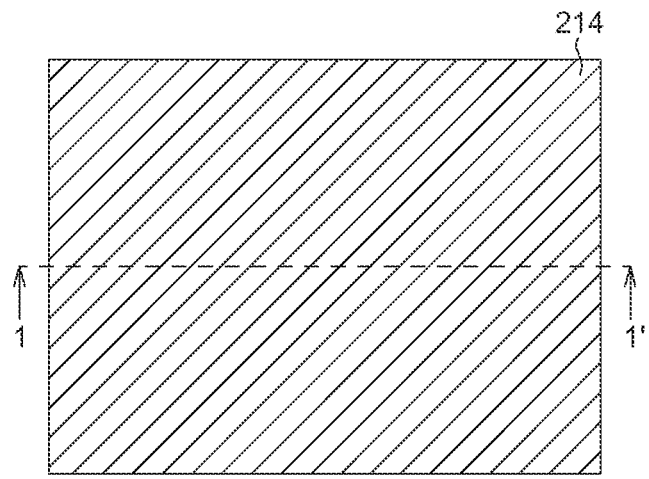
Figure 2B:
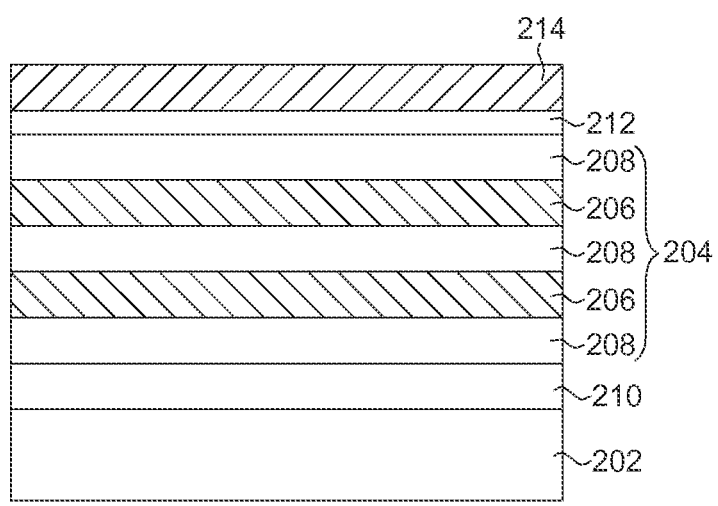

Please refer to FIGS. 2A~2B, of which FIG. 2B shows the 1-1' cross section of FIG. 2A. At the beginning, a substrate 202 with a stack 204 thereover is provided. The stack 204 is composed of alternate semiconductor layers 206 and first insulating layers 208, wherein the semiconductor layers 206 may be formed of, for example, polysilicon, and the first insulating layers 208 may be formed of, for example, an oxide. While two semiconductor layers 206 and three first insulating layers 208 are shown in the figures, the numbers of the semiconductor layers 206 and the first insulating layers 208 are not limited thereto. The stack 204 may comprise numerous semiconductor layers 206 and numerous first insulating layers 208 disposed alternatively.

In one embodiment, as shown in FIG. 2B, a barrier layer 210 is formed on the substrate 202, and the stack 204 is formed on the barrier layer 210. In one embodiment, the barrier layer 210 is formed of, for example, an oxide.

Further, a second insulating layer 212 is formed on the stack 204. The second insulating layer 212 is formed, for example, from an oxide. A first conductive layer 214 is formed on the second insulating layer 212. The first conductive layer 214 is formed of, for example, P+ polysilicon or conductor. In one embodiment, the thickness of the first conductive layer 214 may be in a range of, for example, 100 Å~1500 Å.

Figure 3A:
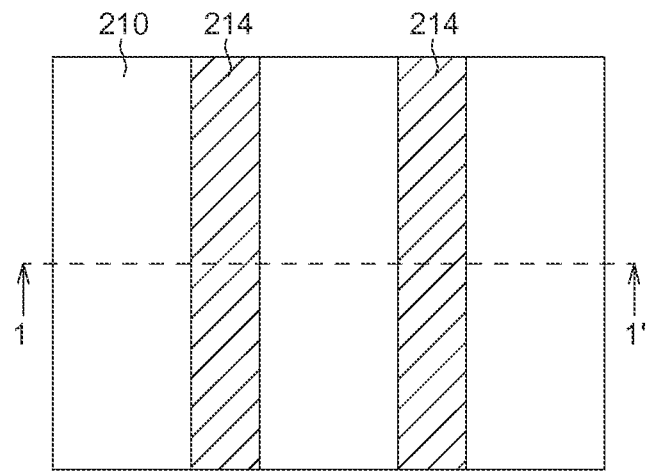
Figure 3B:
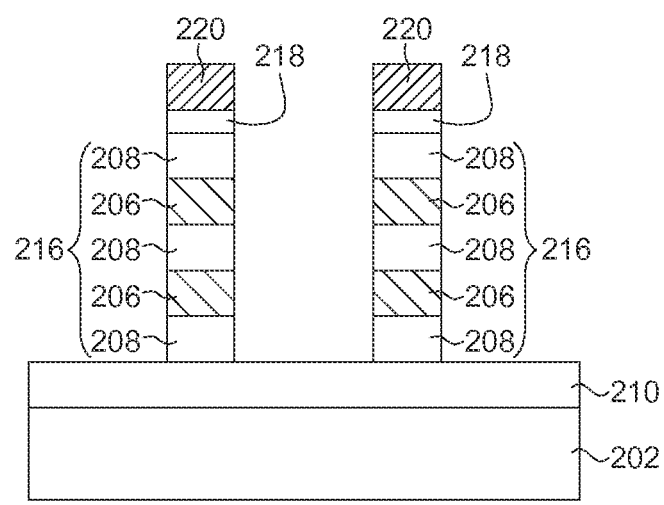

Please refer to FIGS. 3A~3B, of which FIG. 3B shows the 1-1' cross section of FIG. 3A. The first conductive layer 214, the second insulating layer 212 and the stack 204 are patterned to form a plurality of bit line stacks 216, a plurality of second insulating layers 218 corresponding to the bit line stacks 216, and a plurality of first conductive layers 220 corresponding to the bit line stacks 216. The patterning step may be accomplished by etching. In one embodiment, as shown in FIG. 3B, the barrier layer 210 is used as an etch stop layer and stops the etching step.

Figure 4A:
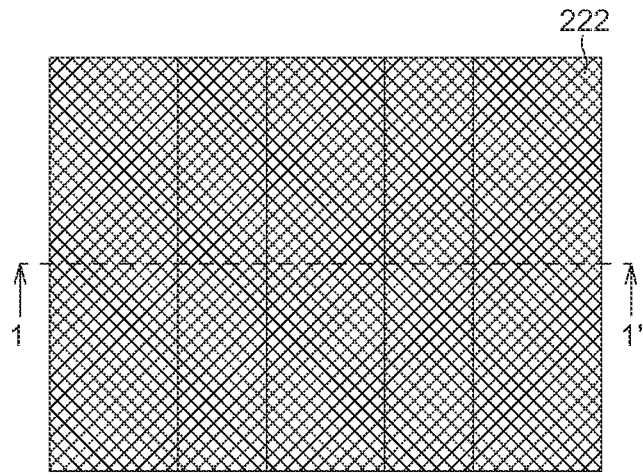
Figure 4B:
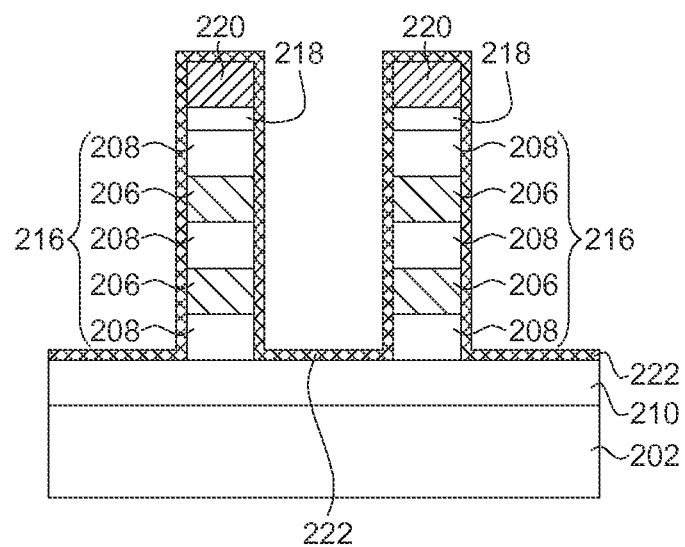

Please refer to FIGS. 4A~4B, of which FIG. 4B shows the 1-1' cross section of FIG. 4A. A memory layer 222 is formed and covers the bit line stacks 216. The memory layer 222 may be formed by deposition. The memory layer 222 may have an ONO or ONONO structure.

Thereafter, parts of the memory layer 222 are removed to expose the first conductive layers 220, which correspond to the bit line stacks 216. This removing step can be accomplished by the steps illustrated in FIGS. 5A~8B.

Figure 5A:
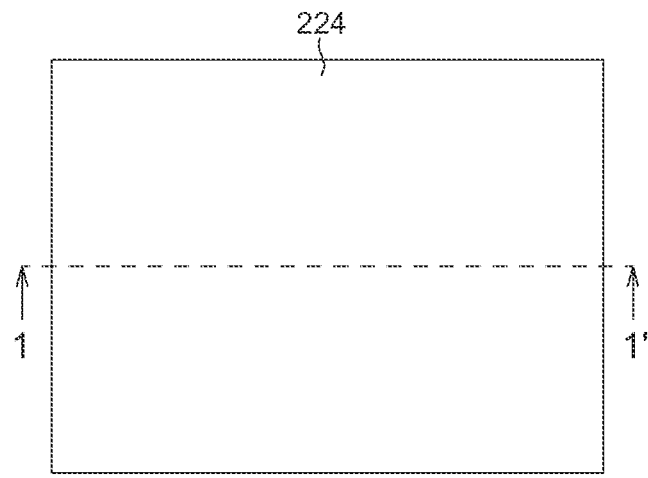
Figure 5B:
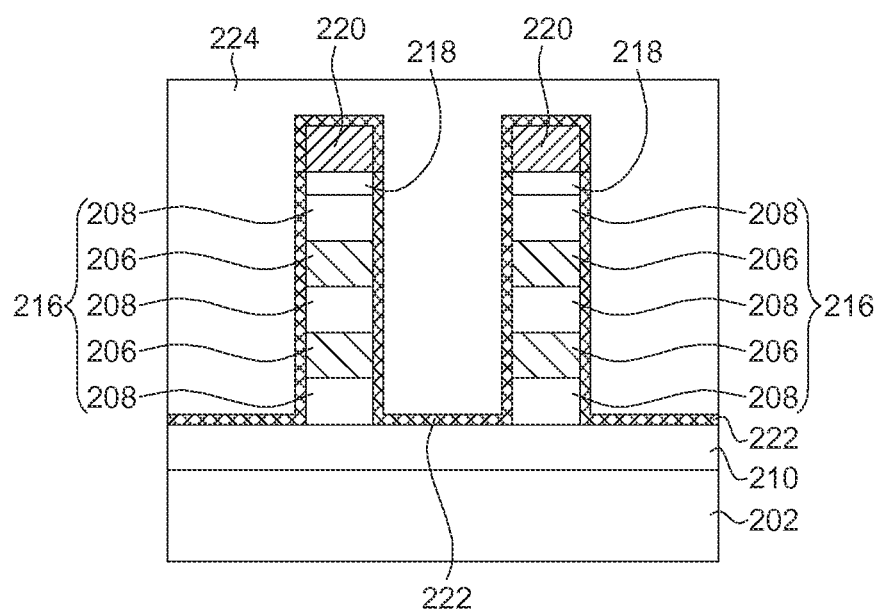

Please refer to FIGS. 5A~5B, of which FIG. 5B shows the 1-1' cross section of FIG. 5A. A sacrificial or disposable layer 224 is formed on the memory layer 222. In one embodiment, the disposable layer 224 is formed by, for example, deposition or spin coating. In one exemplary embodiment, the disposable layer 224 is formed by coating a material, such as an organic dielectric layer (ODL) or a bottom antireflection coating (BARC), on which the etching process is selective over oxide. The disposable layer 224 covers the memory layer 222 completely for planarizing the upper surface of the structure.

Figure 6A:
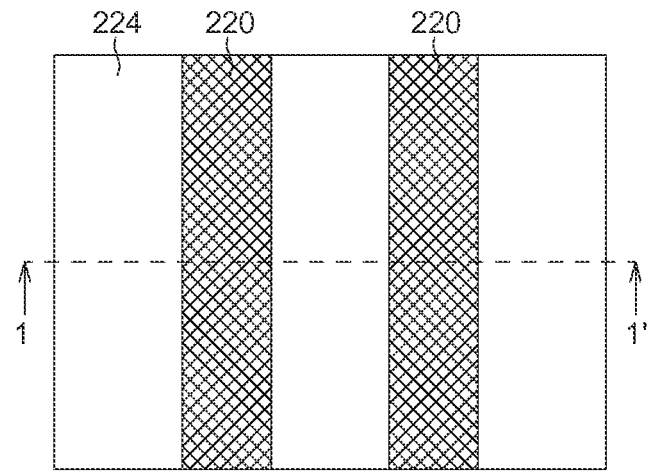
Figure 6B:
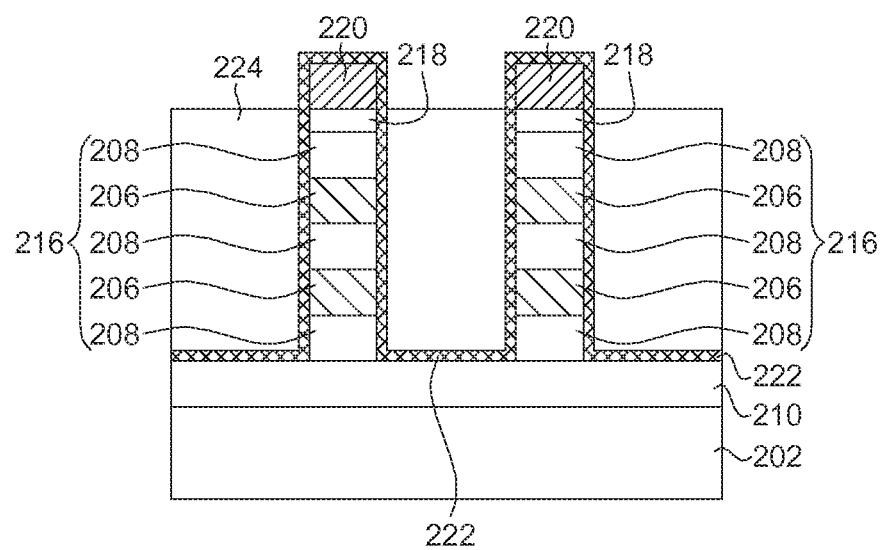

Please refer to FIGS. 6A~6B, of which FIG. 6B shows the 1-1' cross section of FIG. 6A. After the disposable layer 224 is formed, the disposable layer 224 is etched to expose parts of the memory layer 222, as shown in FIG. 6B. Since the etching process on the disposable layer 224 is selective, the memory layer 222 and the portions covered by the memory layer 222 will not be etched. The etching process on the disposable layer 224 may stop at the same level as the first conductive layers 220 or the second insulating layers 218.

However, the etching process on the disposable layer 224 will not stop at a level lower than the top level of the first insulating layers 208 of the bit line stacks 216. In one exemplary embodiment, as shown in FIG. 6B, the etching process on the disposable layer 224 stops at a level that the first conductive layers 220 are exposed from the disposable layer 224.

Figure 7A:
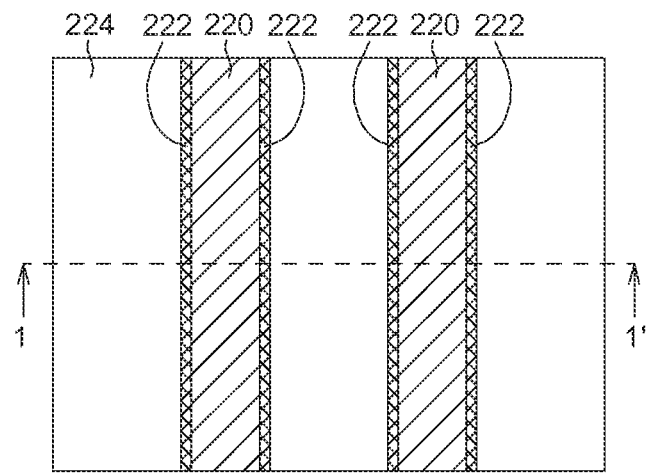
Figure 7B:
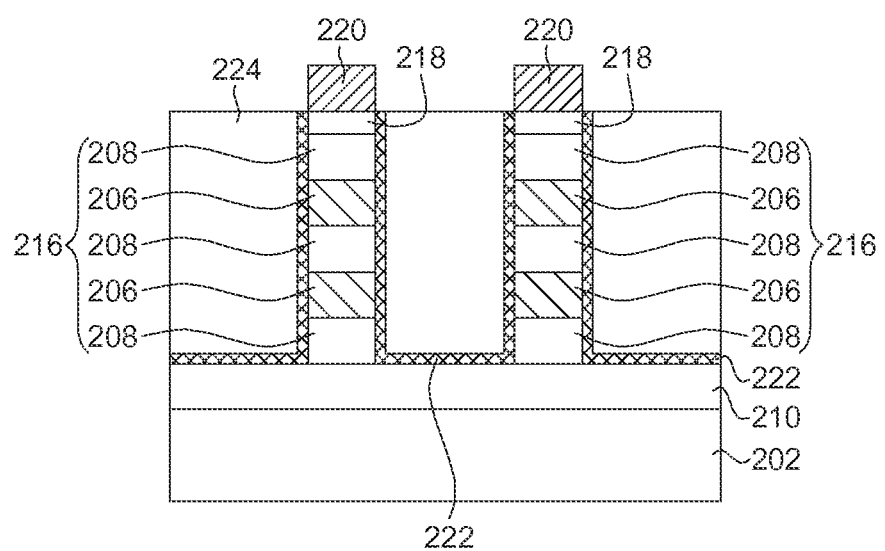

Please refer to FIGS. 7A~7B, of which FIG. 7B shows the 1-1' cross section of FIG. 7A. The portions of the memory layer 222 that are exposed from the disposable layer 224 are removed to expose the first conductive layers 220. In one exemplary embodiment, as shown in FIG. 6B, the etching process on the disposable layer 224 stops at the level that the first conductive layers 220 are exposed from the disposable layer 224, thereby the first conductive layers 220 are exposed after said portions of the memory layer 222 are removed, as shown in FIG. 7B. It is to be noted, however, that the bit line stacks 216 should not be exposed in order to prevent a short circuit due to the contact between the semiconductor layers 206 of the bit line stacks 216 and liners (such as liners 226 shown in FIG. 9B) formed in the following processing steps.

Figure 8A:
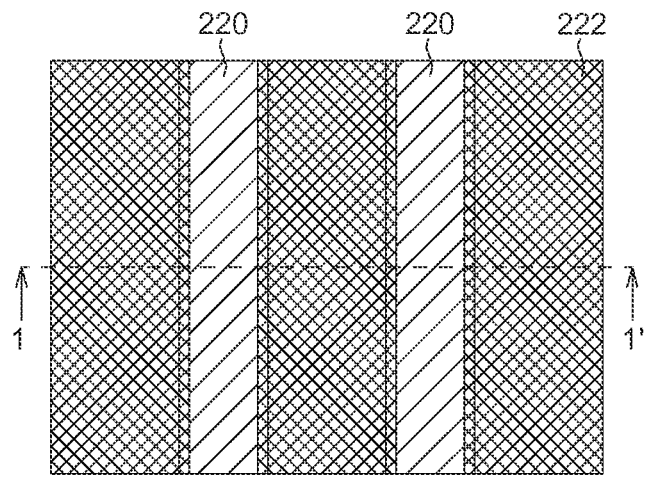
Figure 8B:
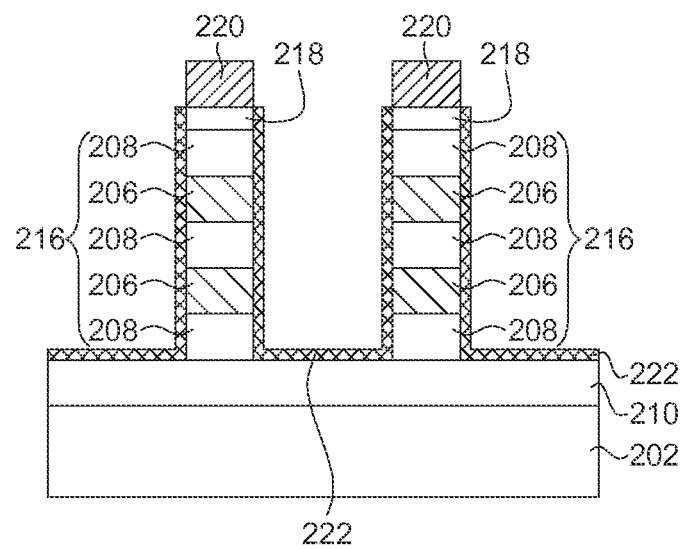

Please refer to FIGS. 8A~8B, of which FIG. 8B shows the 1-1' cross section of FIG. 8A. The disposable layer 224 is removed. In one embodiment, the disposable layer 224 is removed by, for example, dry strip or wet strip.

Figure 9A:
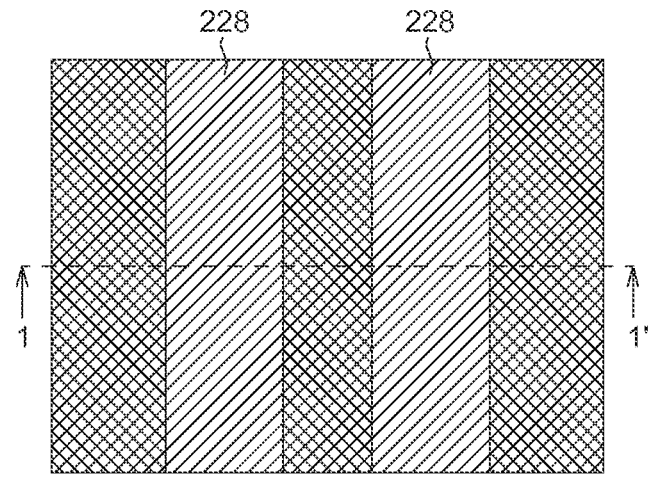
Figure 9B:
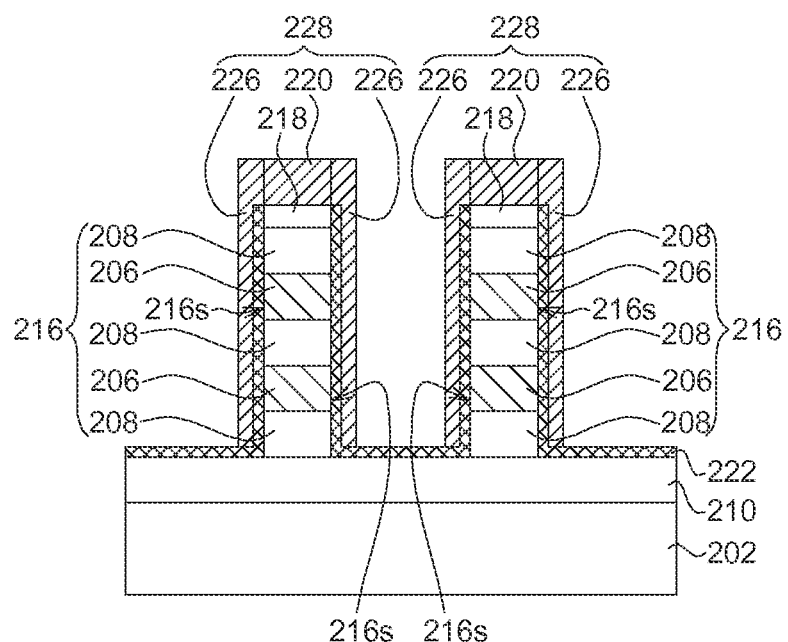

Please refer to FIGS. 9A~9B, of which FIG. 9B shows the 1-1' cross section of FIG. 9A. A plurality of liners 226 are formed respectively along sidewalls 216s of the bit line stacks 216, such that the liners 226 are connected with the first conductive layers 220 to form a plurality of string select structures 228. In one embodiment, the liners 226 are formed by, for example, deposition and etching process. In one embodiment, the liners 226 are formed of the same material as the first conductive layers 220, such as P+ polysilicon or conductor.

Figure 10A:
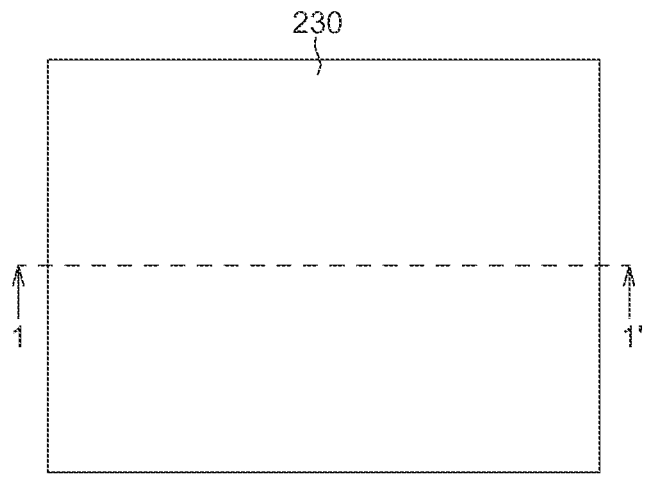
Figure 10B:
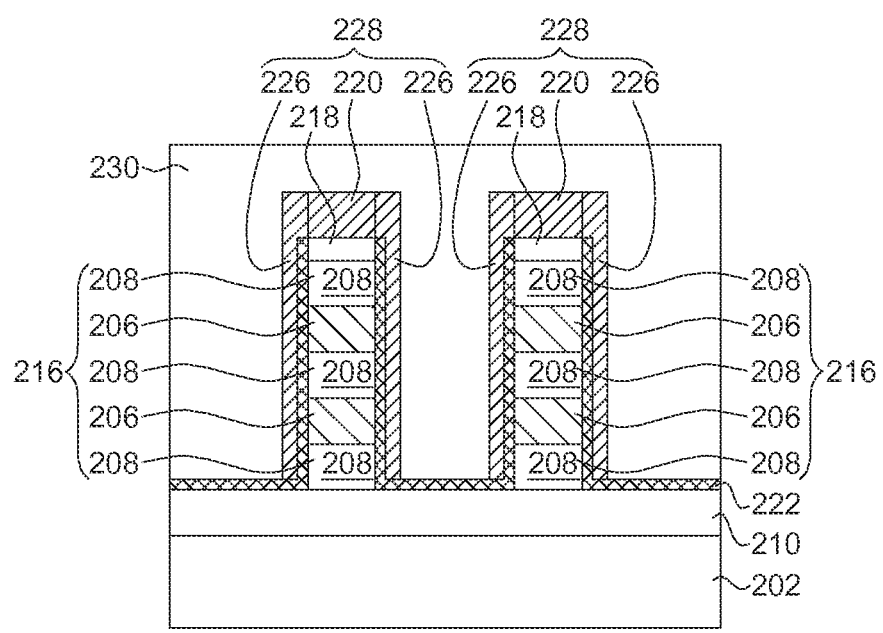

Please refer to FIGS. 10A~10B, of which FIG. 10B shows the 1-1' cross section of FIG. 10A. After the string select structures 228 are formed, a sacrificial layer 230 is formed orthogonally to the bit line stacks 216. The sacrificial layer 230 covers the string select structures 228 completely for planarizing the upper surface of the structure.

In one embodiment, the sacrificial layer 230 may be formed as a single layer. The single layer is made of a material having good conformality to be filled into trenches or holes with high aspect ratio, such that the single layer has good conformality with the string select structures 228. In particular, the single layer may be made of an organic material having good conformality with the string select structures 228 and having good temperature resistance up to 400° C.~500° C., such as TOPAZ™, which is available from Applied Materials, Inc. In cases that TOPAZ™ is used to fabricate the sacrificial layer 230, the following processing steps may be conducted at a temperature up to the range of 400° C.~500° C. It is to be noted, however, that the structure should be isolated from oxygen during the process to prevent TOPAZ™ ashing away. TOPAZ™ is highly selective to polysilicon/oxide/SiN during reactive ionic etch.

In another embodiment, the sacrificial layer 230 may be formed as a dual layer. The bottom layer of the dual layer is made of a material having good conformality with the string select structures 228, such as a material selected from a group consisting of TOPAZ™ and an ODL material. The top layer of the dual layer is made of, for example, a material selected from a group consisting of a silicon-containing hard mask bottom antireflection coating (SHB), a dielectric antireflection coating (DARC), oxide, silicon nitride (SiN) and polysilicon. In cases that the bottom layer of the dual layer is made of TOPAZ™, the top layer may be made of SHB, DARC, oxide, silicon nitride or polysilicon. In cases that the bottom layer is made of ODL, the top layer may be made of SHB.

Figure 11A:
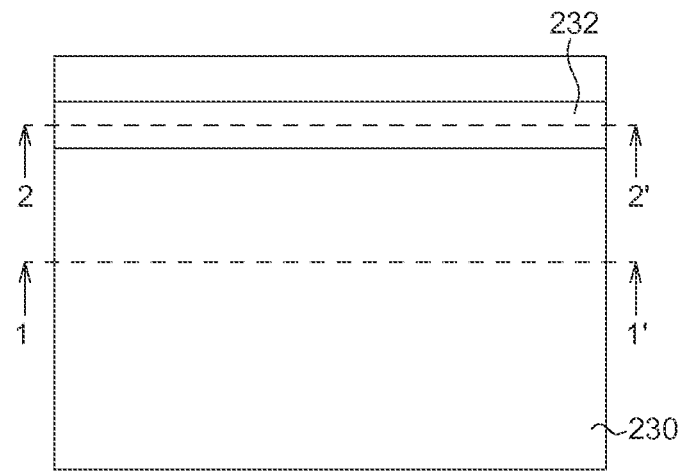
Figure 11B:
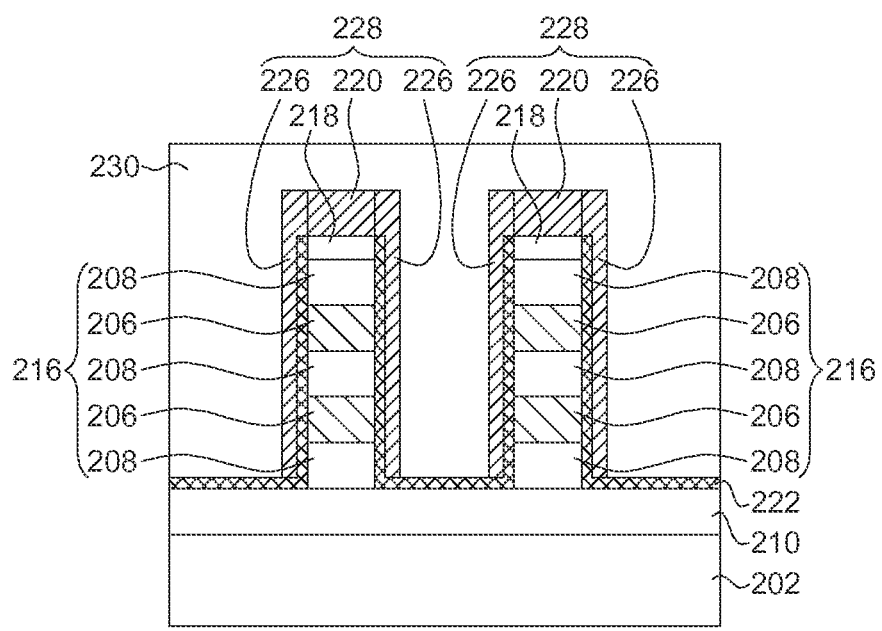
Figure 11C:
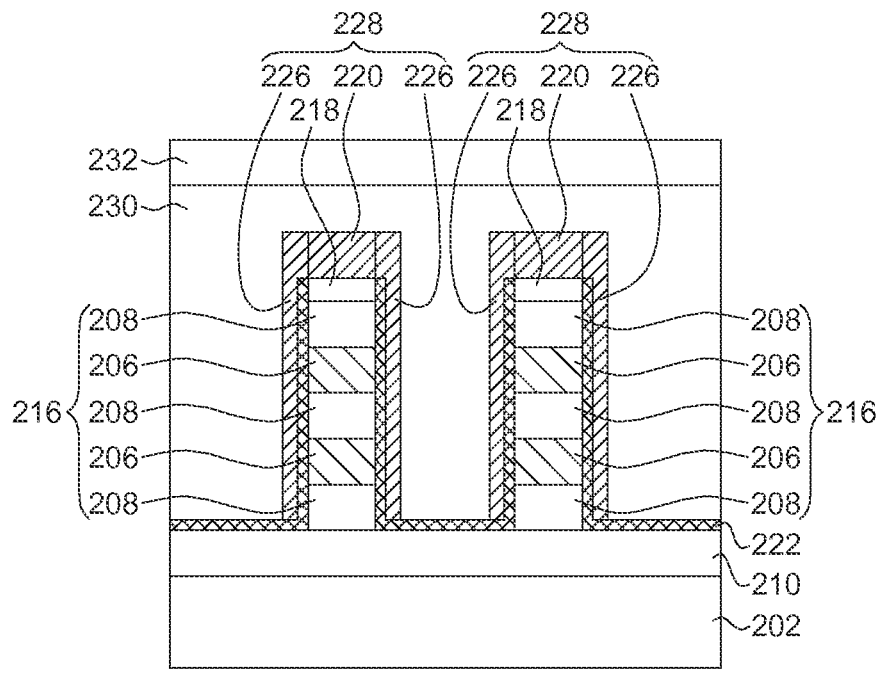

Please refer to FIGS. 11A~11C, of which FIG. 11B shows the 1-1' cross section of FIG. 11A, and FIG. 11C shows the 2-2' cross section of FIG. 11A. A photoresist layer 232 is formed on the sacrificial layer 230 at a position corresponding to the string select structures 228. The photoresist layer 232 is arranged orthogonally to the bit line stacks 216.

Figure 12A:
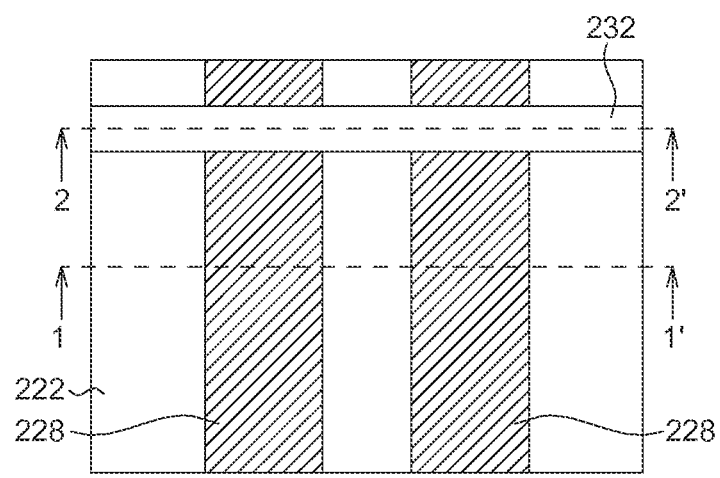
Figure 12B:
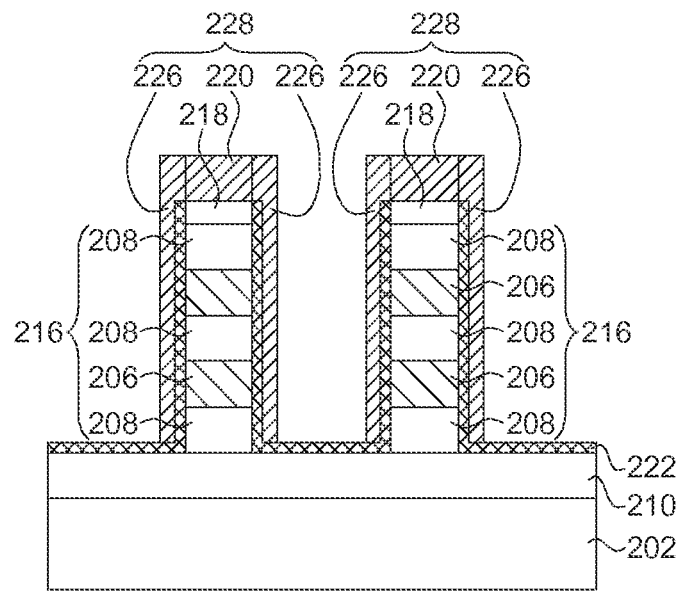
Figure 12C:
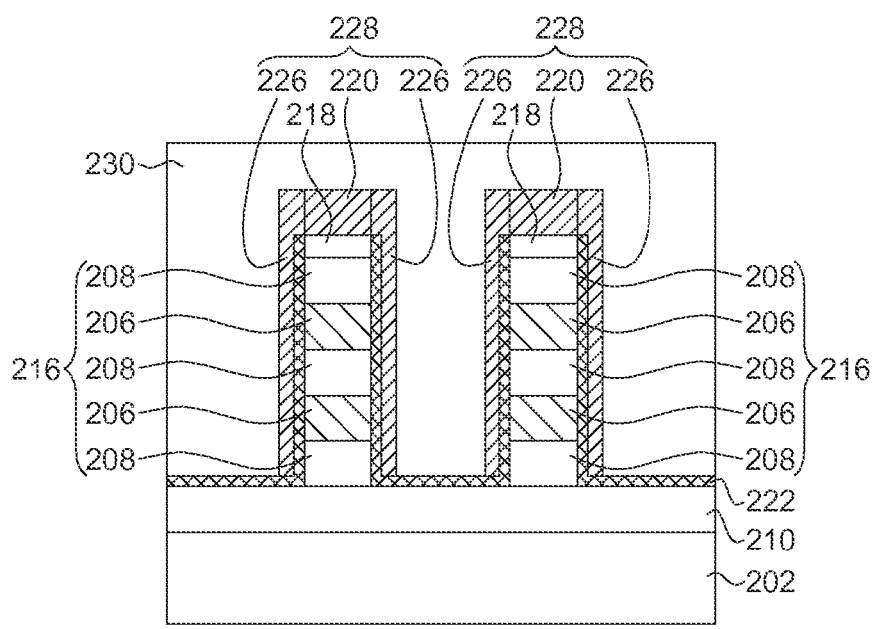

Please refer to FIGS. 12A~12C, of which FIG. 12B shows the 1-1' cross section of FIG. 12A, and FIG. 12C shows the 2-2' cross section of FIG. 12A. The portions of the sacrificial layer 230 that are not covered by the photoresist layer 232 are etched. In one embodiment, the etching process may be conducted by reactive ion etching. The sacrificial layer 230 formed of organic material (such as TOPAZ™) is removed by the reactive ion etching process, while the string select structures 228 and the memory layer 222, which may have polysilicon or oxide surfaces, will not be etched. The reactive ion etching process stops at, for example, the memory layer 222 or the barrier layer 210. The photoresist layer 232 is removed during the reactive ion etching process of the sacrificial layer 230. In some embodiments, the top portion of the sacrificial layer 230 under the photoresist layer 232 may be protected by DARC (in cases that the bottom layer of the dual layer is made of TOPAZ™) or SHB (in cases that the bottom layer of the dual layer is made of ODL). The sacrificial layer 230 orthogonal to the bit line stacks 216 remains, as shown in FIGS. 12A and 12C.

Figure 13A:
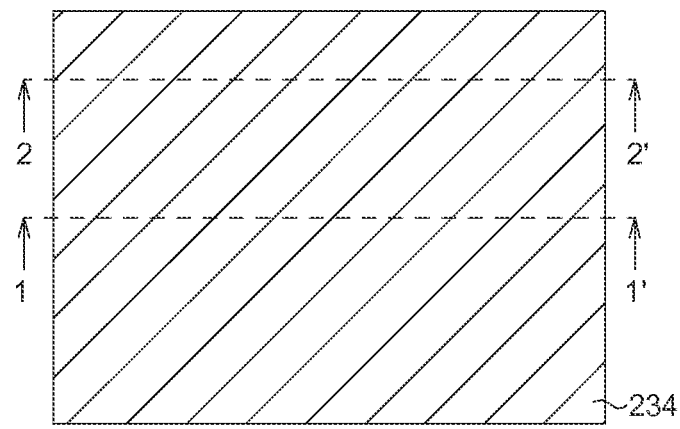
Figure 13B:
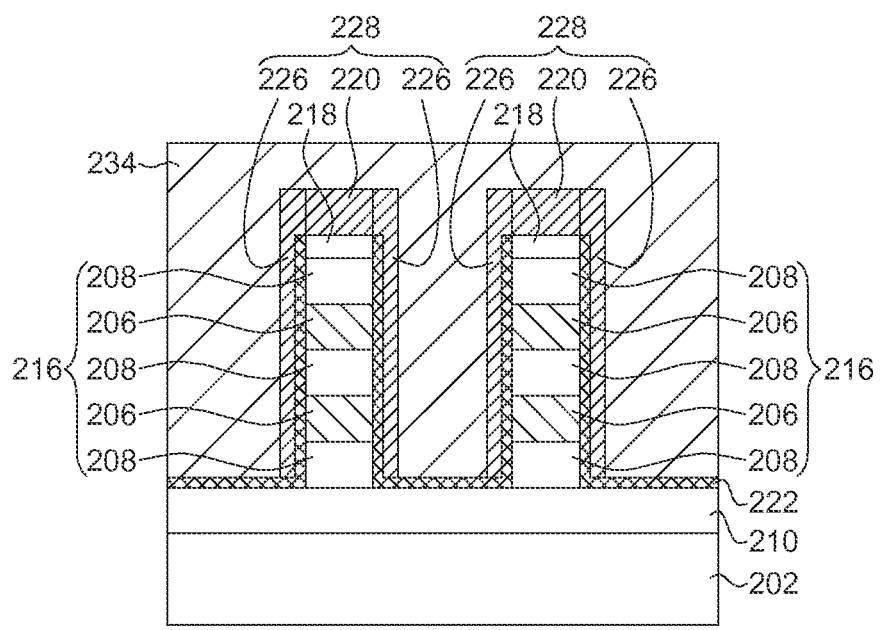
Figure 13C:
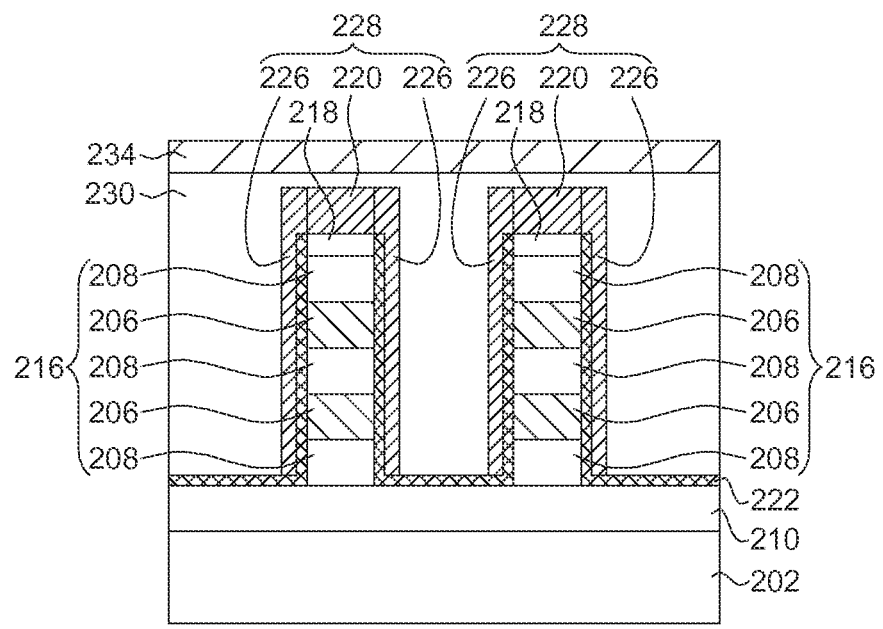

Please refer to FIGS. 13A~13C, of which FIG. 13B shows the 1-1' cross section of FIG. 13A, and FIG. 13C shows the 2-2' cross section of FIG. 13A. A second conductive layer 234 is formed and covers the whole structure. In one embodiment, the second conductive layer 234 may be formed by deposition, such as chemical vapor deposition (CVD). The second conductive layer 234 is formed of, for example, P+ polysilicon or conductor. In cases that the sacrificial layer 230 is made of TOPAZ™, a layer of tungsten (W), tungsten silicide (WSi) or other materials having good conductivity and able to be deposited at a temperature not higher than 500° C. may be used as the second conductive layer 234.

Figure 14A:
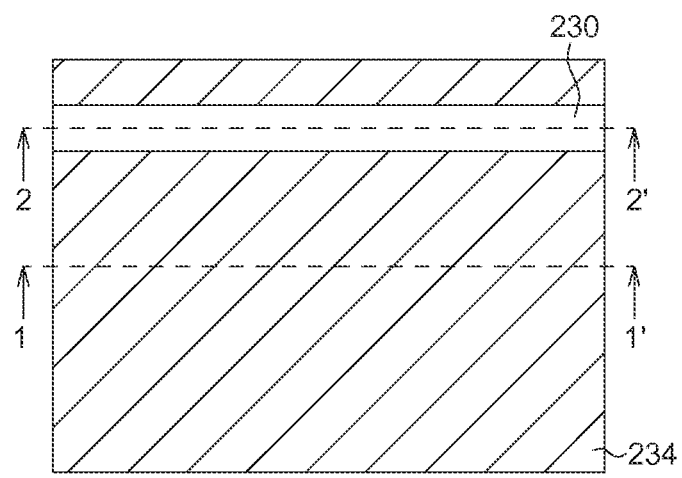
Figure 14B:
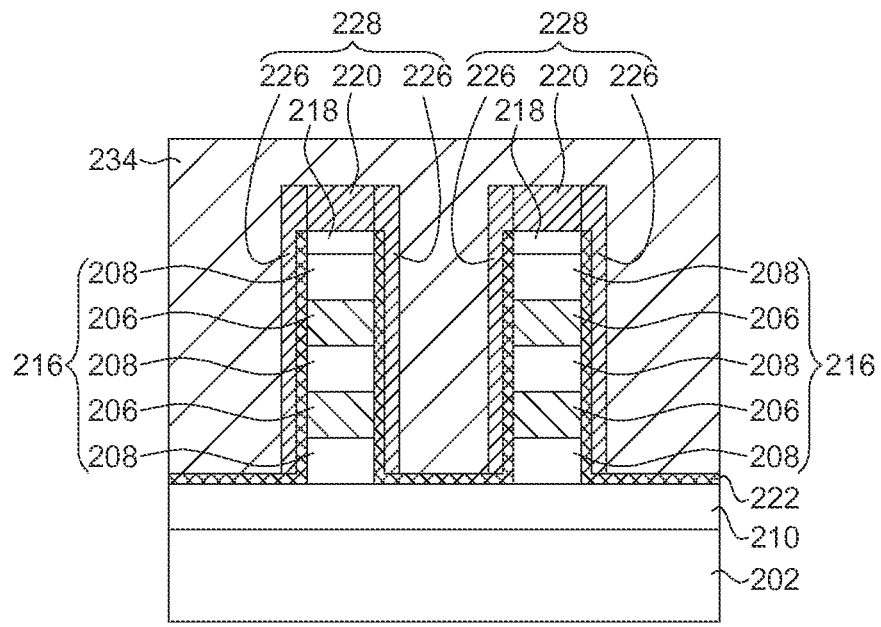
Figure 14C:
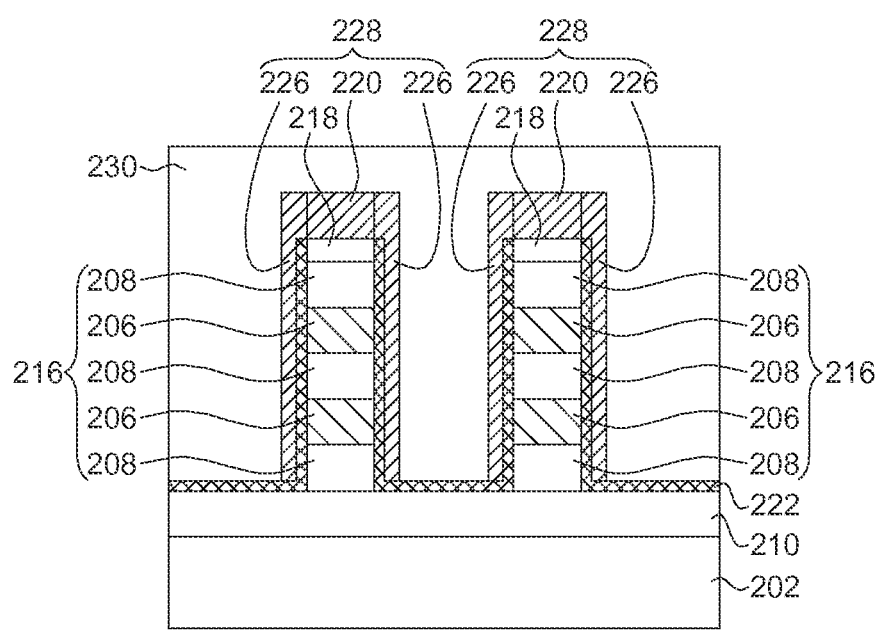

Please refer to FIGS. 14A~14C, of which FIG. 14B shows the 1-1' cross section of FIG. 14A, and FIG. 14C shows the 2-2' cross section of FIG. 14A. Unnecessary portions of the second conductive layer 234 are removed, such that the sacrificial layer 230 is exposed from the second conductive layer 234 at the position corresponding to the string select structures 228. In one embodiment, the removing step is accomplished by etching, which stops at TOPAZ™ (in cases that the sacrificial layer 230 is a single layer) or SHB (in cases that the sacrificial layer 230 is a dual layer).

Figure 15A:
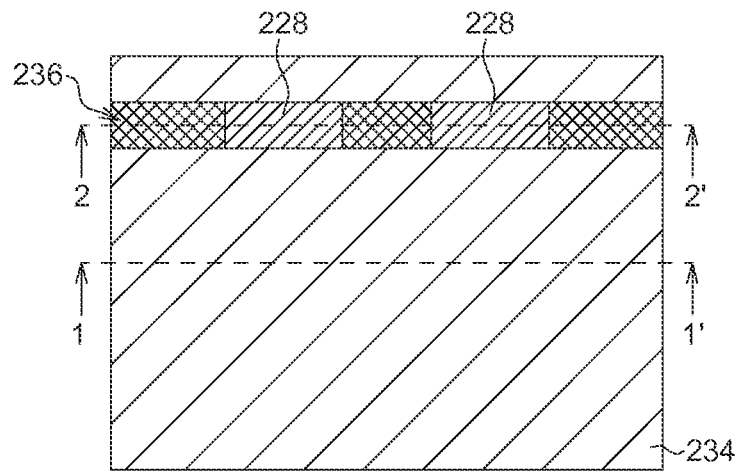
Figure 15B:
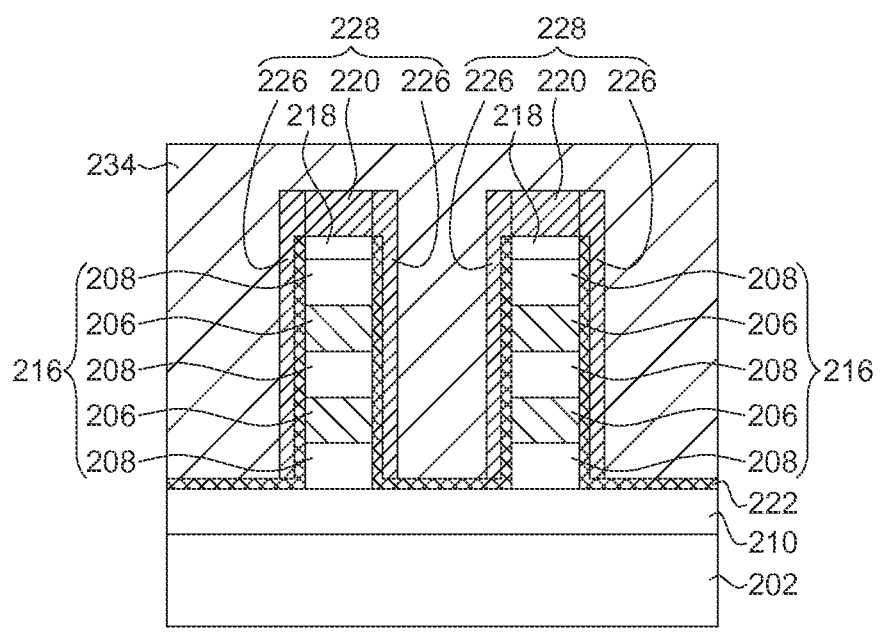
Figure 15C:
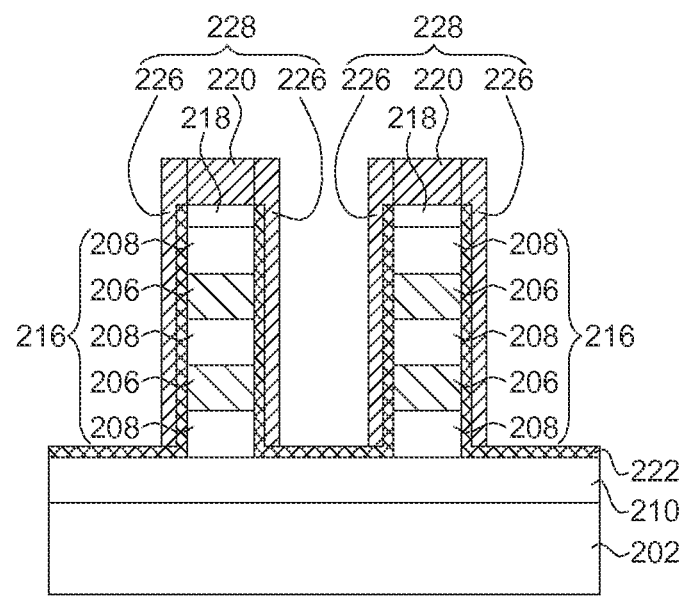

Please refer to FIGS. 15A~11C, of which FIG. 15B shows the 1-1' cross section of FIG. 15A, and FIG. 15C shows the 2-2' cross section of FIG. 15A. The sacrificial layer 230 is removed, and thereby an opening 236 exposing the string select structures 228 is produced. In one embodiment, the removing step is accomplished by dry or wet strip. In cases that the sacrificial layer 230 is a dual layer, the top layer of the dual layer will function as a hard mask. In such cases, an earlier additional etching process is needed to remove the top layer.

Figure 16A:
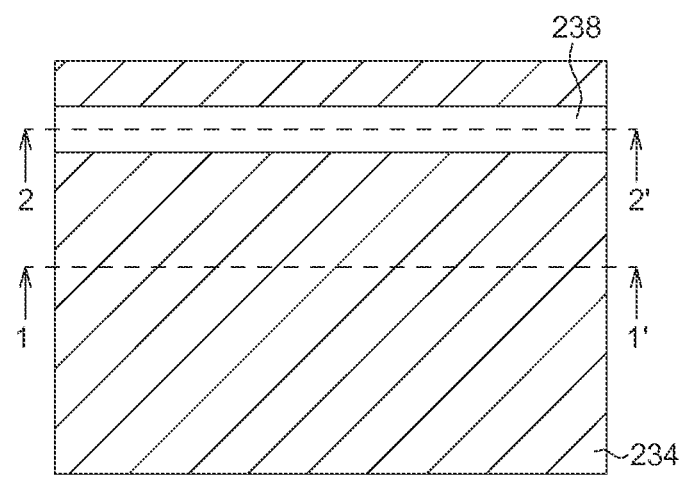
Figure 16B:
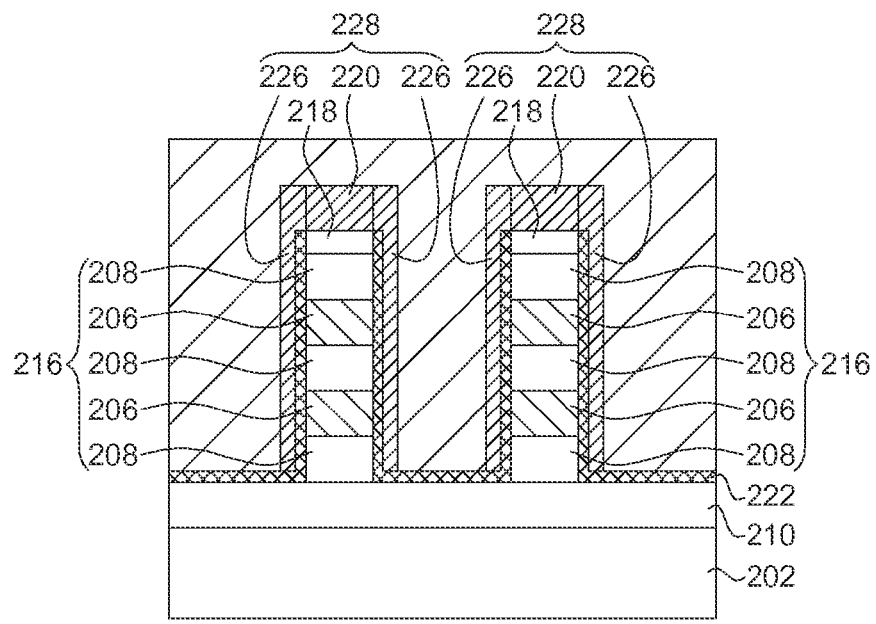
Figure 16C:
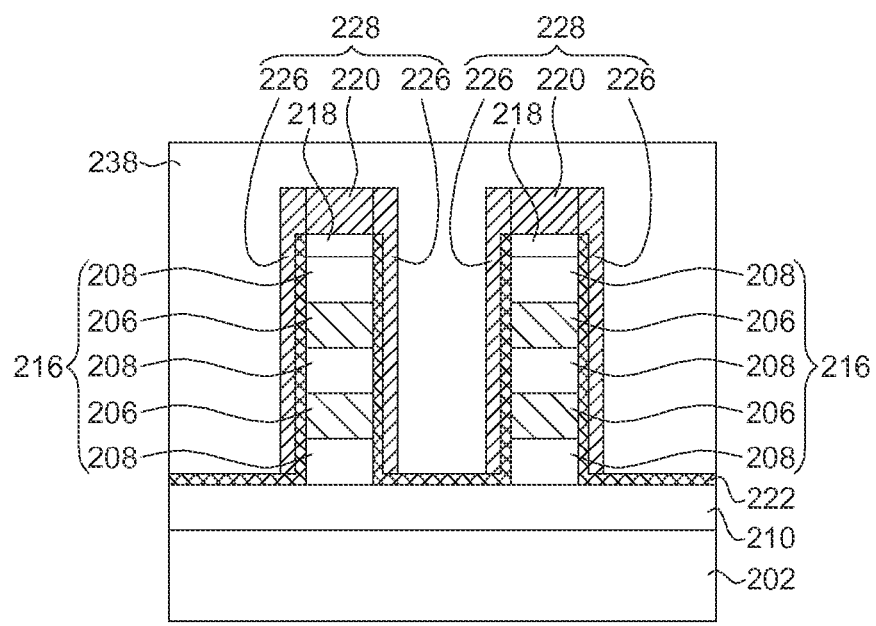

Please refer to FIGS. 16A~16C, of which FIG. 16B shows the 1-1' cross section of FIG. 16A, and FIG. 16C shows the 2-2' cross section of FIG. 16A. A third insulating layer 238 is formed within the opening 236 produced by the removal of the sacrificial layer 230. The third insulating layer 238 may be formed by deposition. In one embodiment, the third insulating layer 238 is, for example, an oxide layer. In one embodiment, chemical mechanical polishing may be conducted to planarize the third insulating layer 238 and the second conductive layer 234.

In the following steps, a plurality of word lines (such as word lines 242 shown in FIG. 18B) are defined. The word lines are parallel to an aligned direction of the string select structures 228 and orthogonal to the bit line stacks 216. The definition of the word lines can be accomplished by the steps illustrated in FIGS. 17A~19D.

Figure 17A:
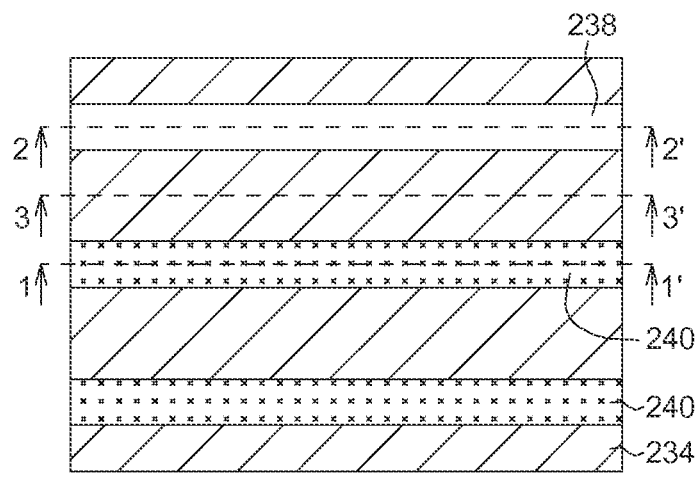
Figure 17B:
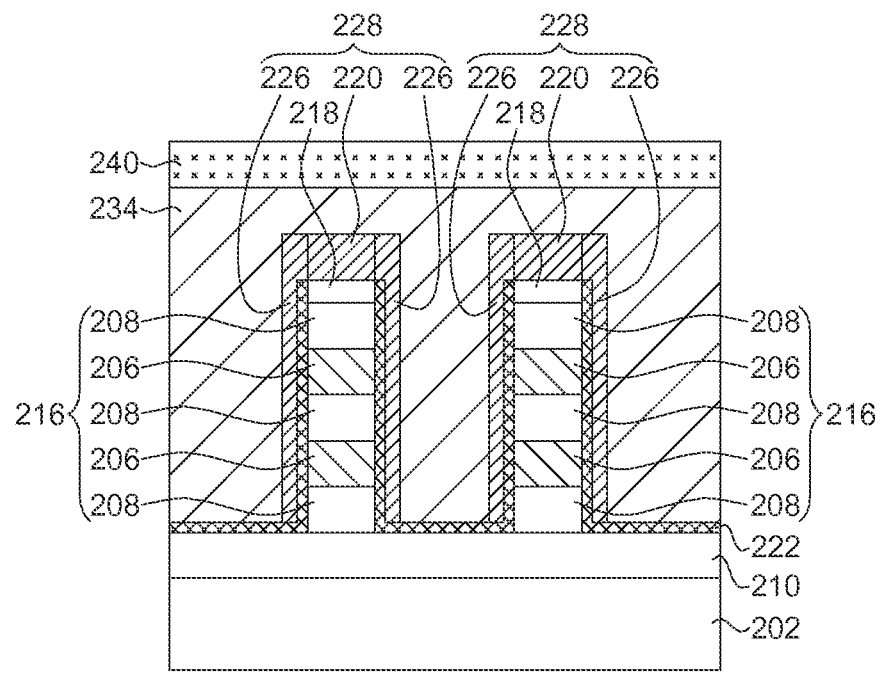
Figure 17C:
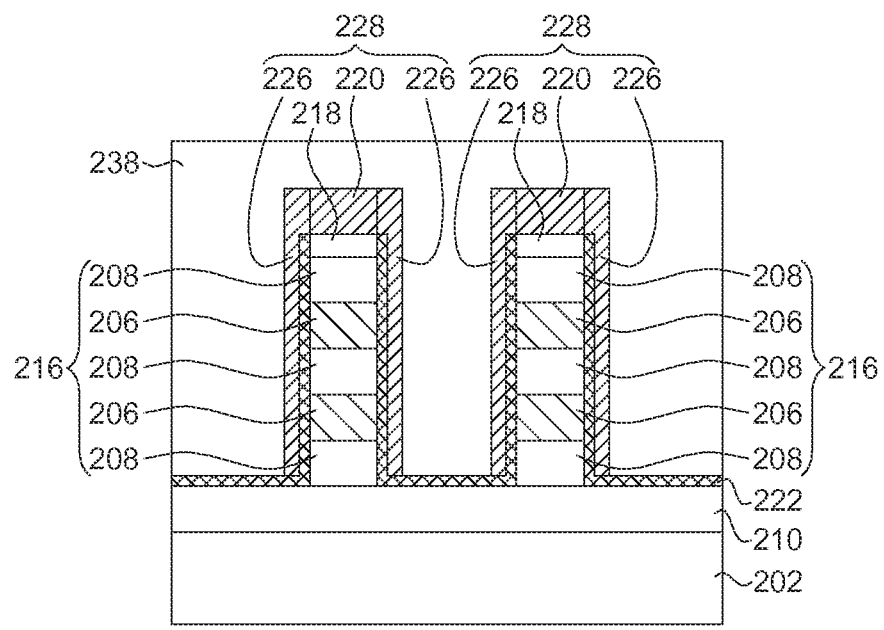
Figure 17D:
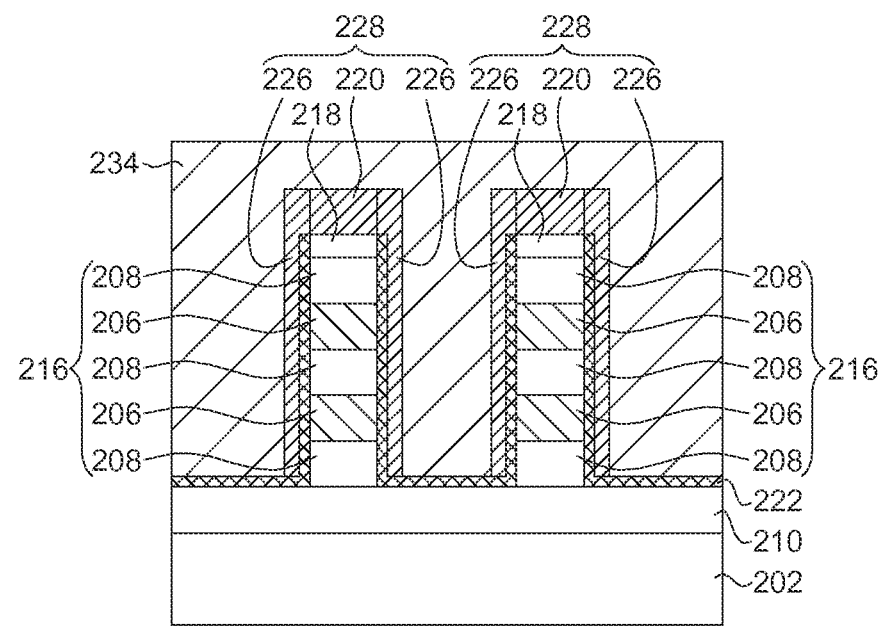

Please refer to FIGS. 17A~17D, of which FIG. 17B shows the 1-1' cross section of FIG. 17A, FIG. 17C shows the 2-2' cross section of FIG. 17A, and FIG. 17D shows the 3-3' cross section of FIG. 17A. A plurality of mask layers 240 are formed at positions corresponding to the word lines to be formed. The mask layers 240 are parallel to the third insulating layer 238 and orthogonal to the bit line stacks 216.

Figure 18A:
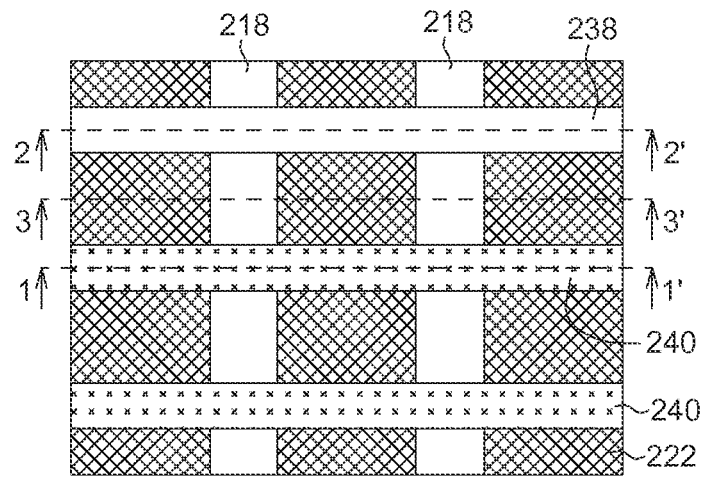
Figure 18B:
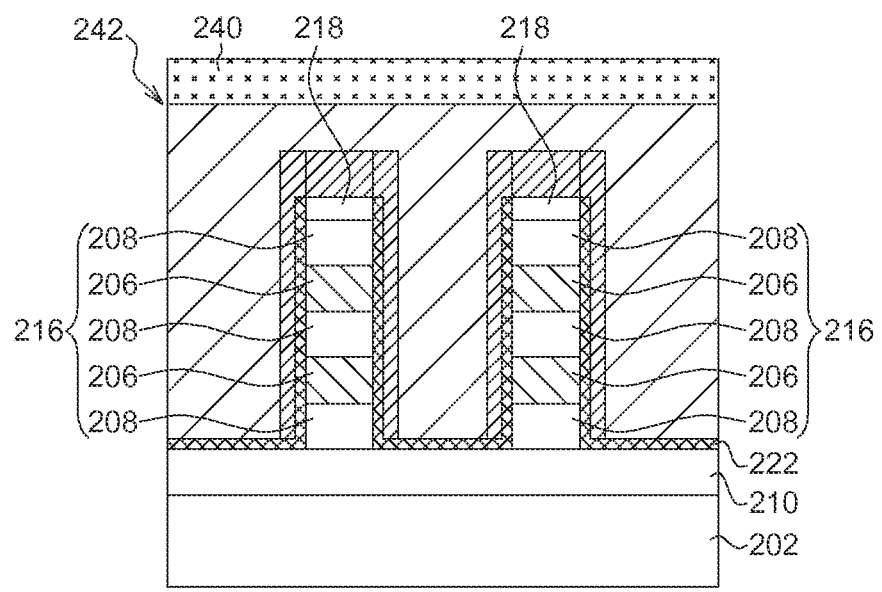
Figure 18C:
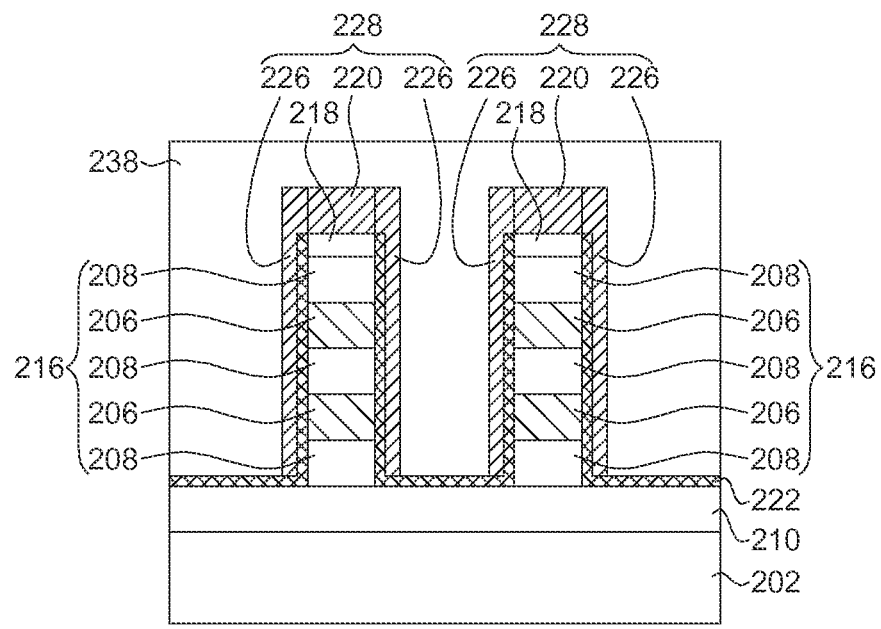
Figure 18D:
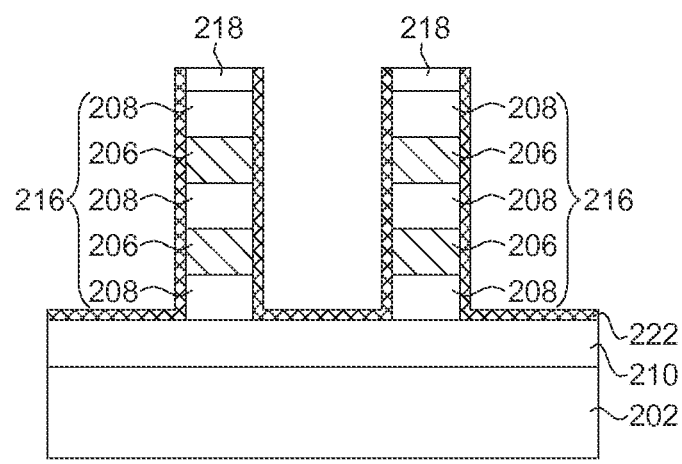

Please refer to FIGS. 18A~18D, of which FIG. 18B shows the 1-1' cross section of FIG. 18A, FIG. 18C shows the 2-2' cross section of FIG. 18A, and FIG. 18D shows the 3-3' cross section of FIG. 18A. The portions of the second conductive layer 234 that are not covered by the mask layers 240 are removed to form a plurality of word lines 242. In one embodiment, the removing step is accomplished by, for example, reactive ion etching, which is highly selective over oxide.

Figure 19A:
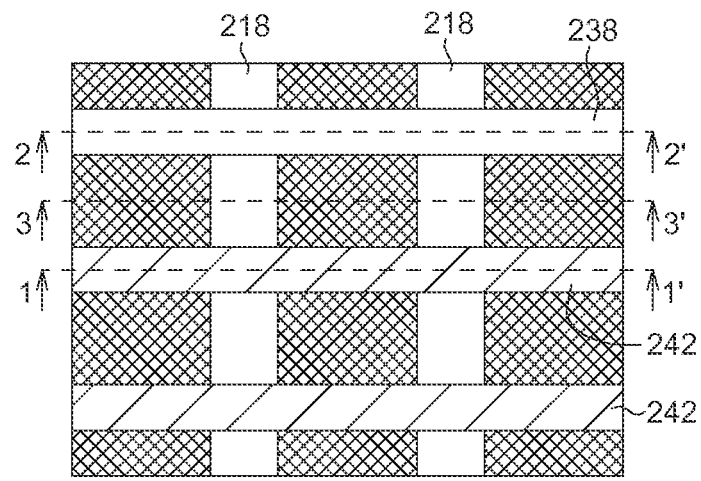
Figure 19B:
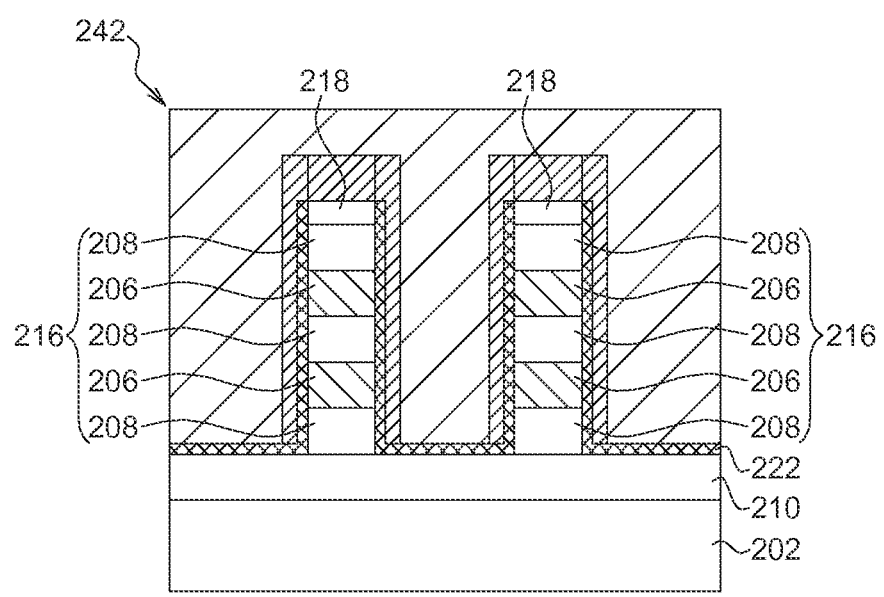
Figure 19C:
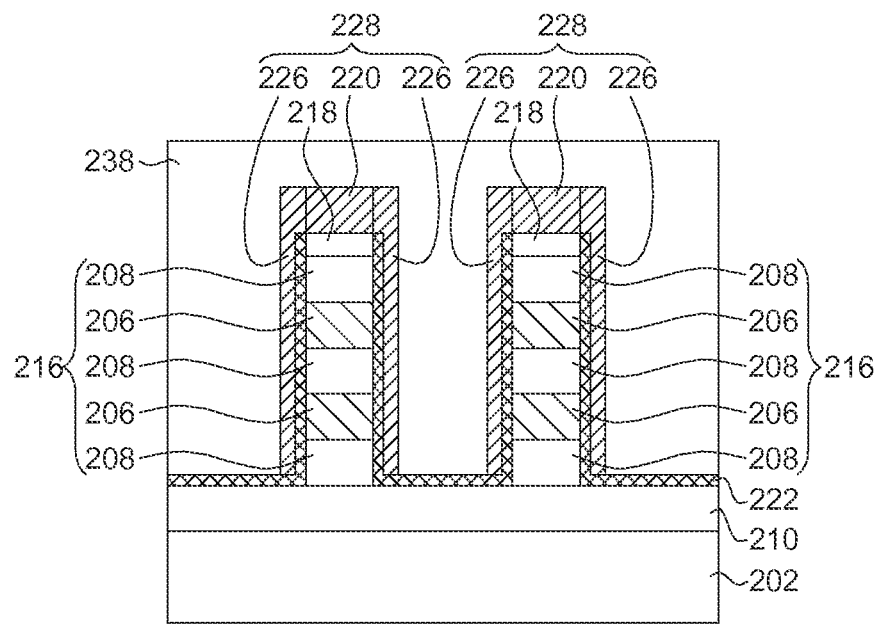
Figure 19D:
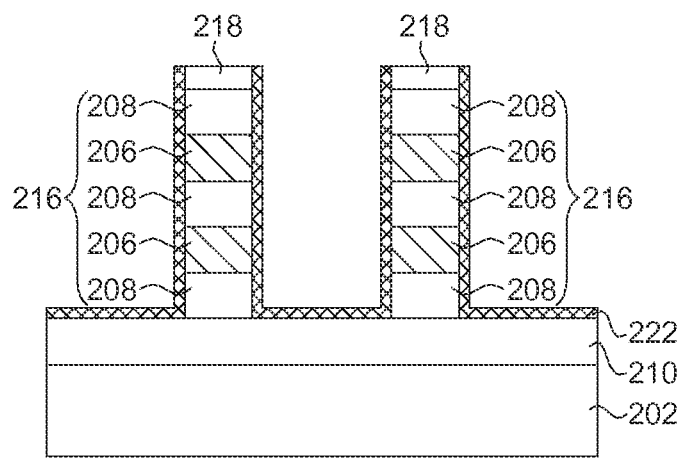

Please refer to FIGS. 19A~19D, of which FIG. 19B shows the 1-1' cross section of FIG. 19A, FIG. 19C shows the 2-2' cross section of FIG. 19A, and FIG. 19D shows the 3-3' cross section of FIG. 19A. After the word lines 242 are formed, the mask layers 240 are removed. In one embodiment, the removing step is accomplished by, for example, strip.

Figure 20A:
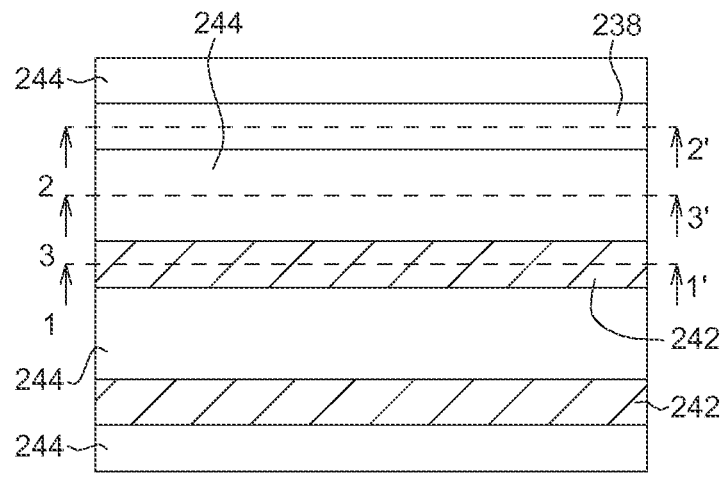
Figure 20B:
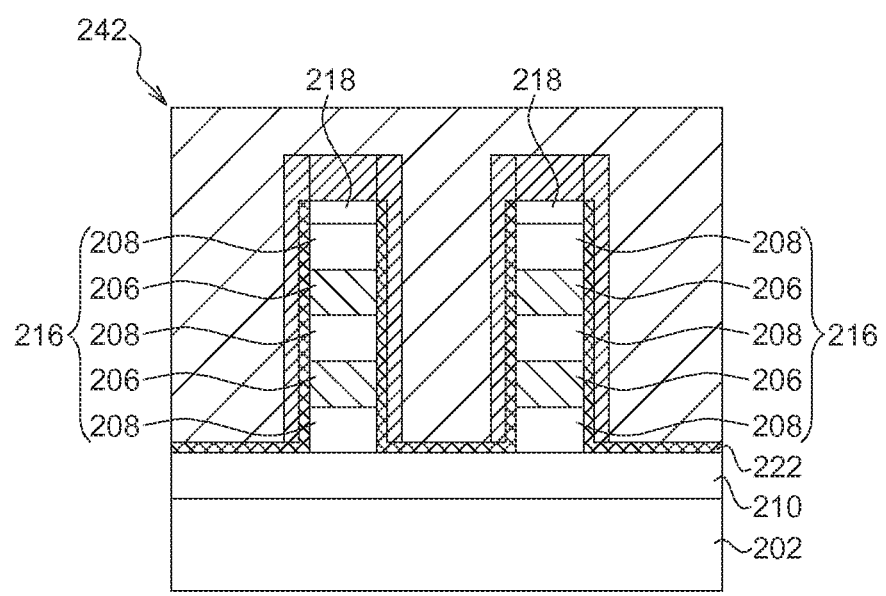
Figure 20C:
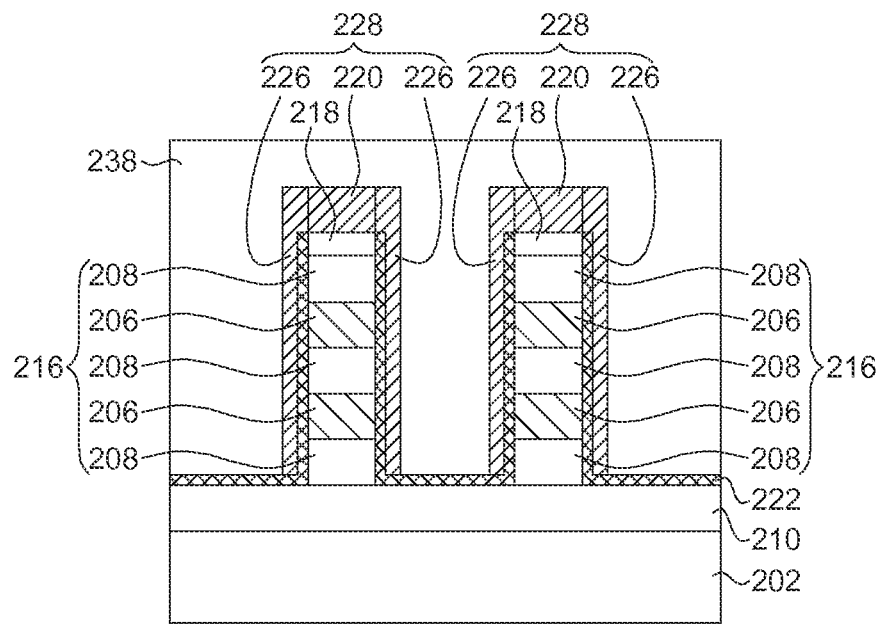
Figure 20D:
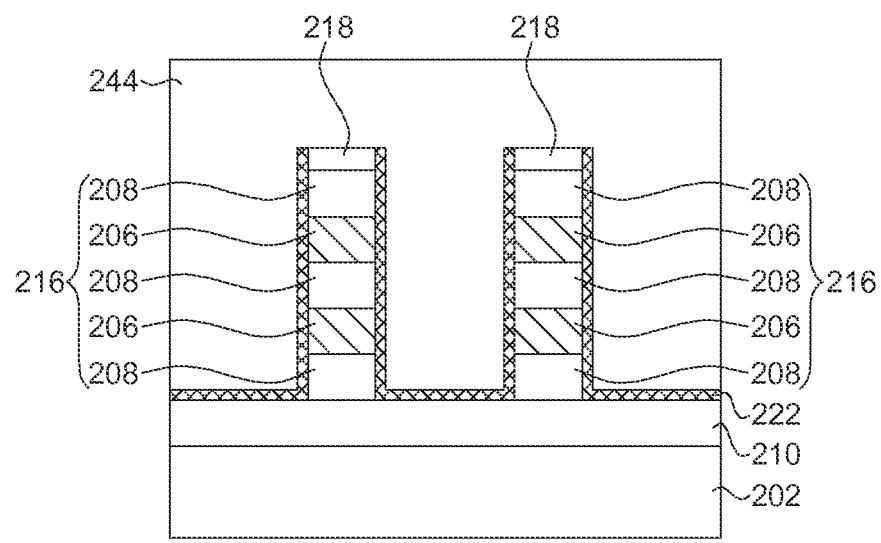

Please refer to FIGS. 20A~20D, of which FIG. 20B shows the 1-1' cross section of FIG. 20A, FIG. 20C shows the 2-2' cross section of FIG. 18A, and FIG. 20D shows the 3-3' cross section of FIG. 20A. After the word lines 242 are defined, a fourth insulating layer 244 is filled into the spaces between the word lines 242, and into the space between the string select structures and one of the word lines which is adjacent to the string select structure. In some embodiment, after the filling process, blanket etch is conducted to expose the word lines 242. In some embodiments, the filling and blanket etch processes may be combined with the manufacturing processes of peripheral spacer module. In one embodiment, the fourth insulating layer 244 may be formed of, for example, an oxide.

After the processing steps described above are finished, other elements of the memory may be formed. For example, please refer to FIG. 21, which corresponds to the cross section illustrated in FIG. 20C. A dielectric layer 246, such as a silicon nitride layer, may be formed over the string select structures 228, the word lines 242 and the fourth insulating layer 244. Subsequently, an interlayer dielectric (ILD) 248 may be formed on the dielectric layer 246. In one embodiment, the interlayer dielectric 248 may be formed by, for example, deposition and chemical mechanical polishing. Thereafter, a plurality of string select conductors 250 may be formed through the interlayer dielectric 248 and the dielectric layer 246. The string select conductors 250 are coupled to the string select structures 228, respectively. In one embodiment, the string select conductors 250 may be formed by etching the interlayer dielectric 248 and the dielectric layer 246, following by tungsten CVD and chemical mechanical polishing.

Figure 21:
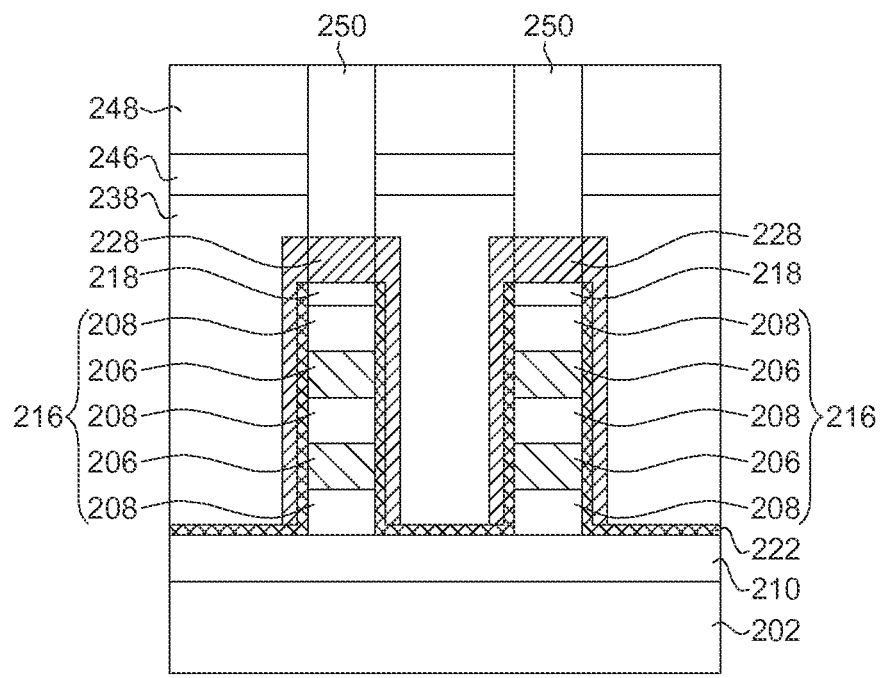

While a gap is shown between the string select structures 228 and the dielectric layer 246 in FIG. 21, the top surface of the third insulating layer 238 may substantially be at the same level as the top surface of the string select structures 228, and the dielectric layer 246 contact the string select structures 228 directly. Besides, the string select conductors 250 may out of alignment with the string select structures 228 while keep their function, as long as each of the string select conductors 250 contacts corresponding one of the string select structures 228 and does not contact any one of the other string select structures 228.

The disclosure is now directed to a manufacturing method of a memory as described above according to another embodiment of the present invention. This embodiment is similar to the embodiment(s) described above, and the common features will be omitted for simplicity.

Before the liners 226 are formed, such as at a time that the steps illustrated in FIGS. 4A and 4B just be finished, the portions of the memory layer 222 at positions corresponding to the string select structures 228 to be formed may be removed. For example, said portions of the memory layer 222 may be etched to expose sidewall portions 216$s'$ (shown in FIG. 22) of the bit line stacks 216.

Subsequently, an oxide layer 252 may be formed on the exposed sidewall portions 216$s'$ of the bit line stacks 216. The structure after this step is exemplary shown in FIG. 22.

Thereafter, the processing steps illustrated in FIGS. 9A~20D may be conducted.

In summary, during a manufacturing method according to the present invention, word lines and string select structures are formed at different processing steps. Since the string select structures are formed by a self-aligned process, the structure symmetry is improved. Further, process windows of both the word lines and the string select structures, of which the spacing and width are different, may be obtained by such a manufacturing method.

In addition, in one end of a memory according to the present invention, all of the stacks of semiconductor strips (such as bit line stacks 104 shown in FIG. 1A) are terminated by a single stair-step structure (such as bit line pad structure 124 shown in FIG. 1A), while in the other end, all of the stacks are terminated by a single source contact (such as source contact 126 shown in FIG. 1A). The configuration is beneficial for improvement to the structure symmetry and the structural mechanical strength. Besides, the memory according to the present invention can be formed by a simpler process, and thereby the manufacturing cost is lowered or kept at a low level.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A manufacturing method of a memory, comprising:
providing a substrate with a stack of alternate semiconductor layers and first insulating layers thereover;
forming a second insulating layer on the stack;
forming a first conductive layer on the second insulating layer;
patterning the first conductive layer, the second insulating layer and the stack to form a plurality of bit line stacks, a plurality of second insulating layers corresponding to the bit line stacks, and a plurality of first conductive layers corresponding to the bit line stacks;
forming a memory layer, the memory layer covering the bit line stacks;
removing parts of the memory layer to expose the first conductive layers; and forming a plurality of liners respectively along sidewalls of the bit line stacks, such that the liners are connected with the first conductive layers to form a plurality of string select structures.

2. The manufacturing method according to claim 1, after forming the string select structures, further comprising:
defining a plurality of word lines parallel to an aligned direction of the string select structures and orthogonal to the bit line stacks.

3. The manufacturing method according to claim 2, before defining the word lines, further comprising:
forming a sacrificial layer orthogonal to the bit line stacks;
forming a second conductive layer, the second conductive layer exposing the sacrificial layer at a position corresponding to the string select structures;
removing the sacrificial layer; and
forming a third insulating layer within an opening produced by the removal of the sacrificial layer.

4. The manufacturing method according to claim 3, wherein the sacrificial layer is made of an organic material having good conformality with the string select structures and having good temperature resistance up to 400° C.~500° C.

5. The manufacturing method according to claim 3, wherein the sacrificial layer is formed as a dual layer, the bottom layer of the dual layer is made of a material having good conformality with the string select structures, and the top layer of the dual layer is made of a material selected from a group consisting of a silicon containing hard mask bottom antireflection coating (SHB), a dielectric antireflection coating (DARC), oxide, silicon nitride and polysilicon.

6. The manufacturing method according to claim 3, wherein defining the word lines comprises:
forming a plurality of mask layers parallel to the third insulating layer and orthogonal to the bit line stacks;
removing parts of the second conductive layer that are not covered by the mask layers to form the word lines; and
removing the mask layers.

7. The manufacturing method according to claim 2, after defining the word lines, further comprising:
filling a fourth insulating layer into the spaces between the word lines, and into the space between the string select structures and one of the word lines which is adjacent to the string select structures.

8. The manufacturing method according to claim 7, after filling the fourth insulating layer, further comprising:
forming a dielectric layer on the string select structures, the word lines and the fourth insulating layer;
forming an interlayer dielectric on the dielectric layer; and
forming a plurality of string select conductors through the interlayer dielectric and the dielectric layer, and the string select conductors coupled to the string select structures.

9. The manufacturing method according to claim 1, after forming the memory layer, further comprising:
etching parts of the memory layer to expose sidewall portions of the bit line stacks; and
forming an oxide layer on the exposed sidewall portions.

* * * * *